United States Patent [19]

Nishitani et al.

[11] Patent Number: 5,574,247
[45] Date of Patent: Nov. 12, 1996

[54] CVD REACTOR APPARATUS

[75] Inventors: Eisuke Nishitani, Yokohama; Susmu Tsuzuku; Natsuyo Chiba, both of Tokyo; Shigeru Kobayashi, Hiratsuki; Naoyuki Tamura, Kudamatsu; Norihiro Uchida, Fujisawa, all of Japan

[73] Assignee: Hitachi, Ltd., Tokyo, Japan

[21] Appl. No.: 263,323

[22] Filed: Jun. 21, 1994

[30] Foreign Application Priority Data

Jun. 21, 1993 [JP] Japan .................................. 5-149388
May 20, 1994 [JP] Japan .................................. 6-106460

[51] Int. Cl.⁶ .................................................. C23C 16/00
[52] U.S. Cl. ..................... 118/708; 118/712; 118/715; 118/725; 118/728; 118/729
[58] Field of Search .................................. 118/715, 725, 118/728, 708, 712, 729

[56] References Cited

U.S. PATENT DOCUMENTS

| | | | |
|---|---|---|---|
| 4,932,358 | 6/1990 | Studley | 118/728 |
| 5,000,113 | 3/1991 | Wang | 118/725 |
| 5,063,031 | 11/1991 | Sato | 118/725 |
| 5,094,885 | 3/1992 | Selbrede | 118/725 |
| 5,108,792 | 4/1992 | Anderson | 118/725 |
| 5,292,393 | 3/1994 | Maydan | 118/719 |
| 5,292,554 | 3/1994 | Sinha | 118/725 |
| 5,302,209 | 4/1994 | Maeda | 118/725 |
| 5,317,656 | 5/1994 | Moslehi | 385/12 |
| 5,332,442 | 7/1994 | Kubodera | 118/725 |
| 5,338,363 | 8/1994 | Kawata | 118/725 |

FOREIGN PATENT DOCUMENTS

| | | |
|---|---|---|
| 64-17424 | 1/1989 | Japan . |
| 4130746 | 5/1992 | Japan . |
| 4-226027 | 8/1992 | Japan . |
| 4-233221 | 8/1992 | Japan . |
| 4-268724 | 9/1992 | Japan . |
| 4-294526 | 10/1992 | Japan . |

OTHER PUBLICATIONS

Conference Proceedings of Advanced Metallization of ULSI Applications (1991, NJ and Tokyo; MRS), pp. 167–172 and 249–253 (see Specification p. 5).
Journal of Electrochemical Society, vol. 131 (1984), pp. 1427–1433, "Selective Low Pressure Chemical Vapor Deposition of Tungsten" (See Specification p. 3).
"CVD Technique for VLSI", Report of the first Symposium of the ECS, Japan, 1988, pp. 48–65 (see specification p. 3).
"Integrated Processing for Microelectronics Science and Technology", IBM Journal of Research and Development, vol. 36(2), 1992, p. 233 (see Specification p. 4).
Hitchman, Chemical Vapor Deposition, Principles and Applications, Academic Press, N.Y. ©1993, pp. 112–119.
Hitchman, Chemical Vapor Deposition Principles and Applications, Academic Press, N.Y. ©1993 pp. 32–35.

Primary Examiner—Richard Bueker
Attorney, Agent, or Firm—Kenyon & Kenyon

[57] ABSTRACT

A CVD reactor apparatus includes a substrate clamp for clamping a peripheral edge of the front of a substrate disposed in a CVD reactor and, dividing a space in the reactor into a first space adjacent the front of the substrate and a second space adjacent the backside of the substrate. The apparatus also includes a unit for cooling the surface temperature of an inner wall of the reactor to a temperature equal to or less than a deposition lower limit, and a unit for supplying a CVD gas to the first space adjacent the substrate front and supplying an inert gas to the second space adjacent the substrate backside at different pressures and causing a reaction at only the substrate front, a reaction gas monitor and a substrate temperature monitor.

21 Claims, 27 Drawing Sheets

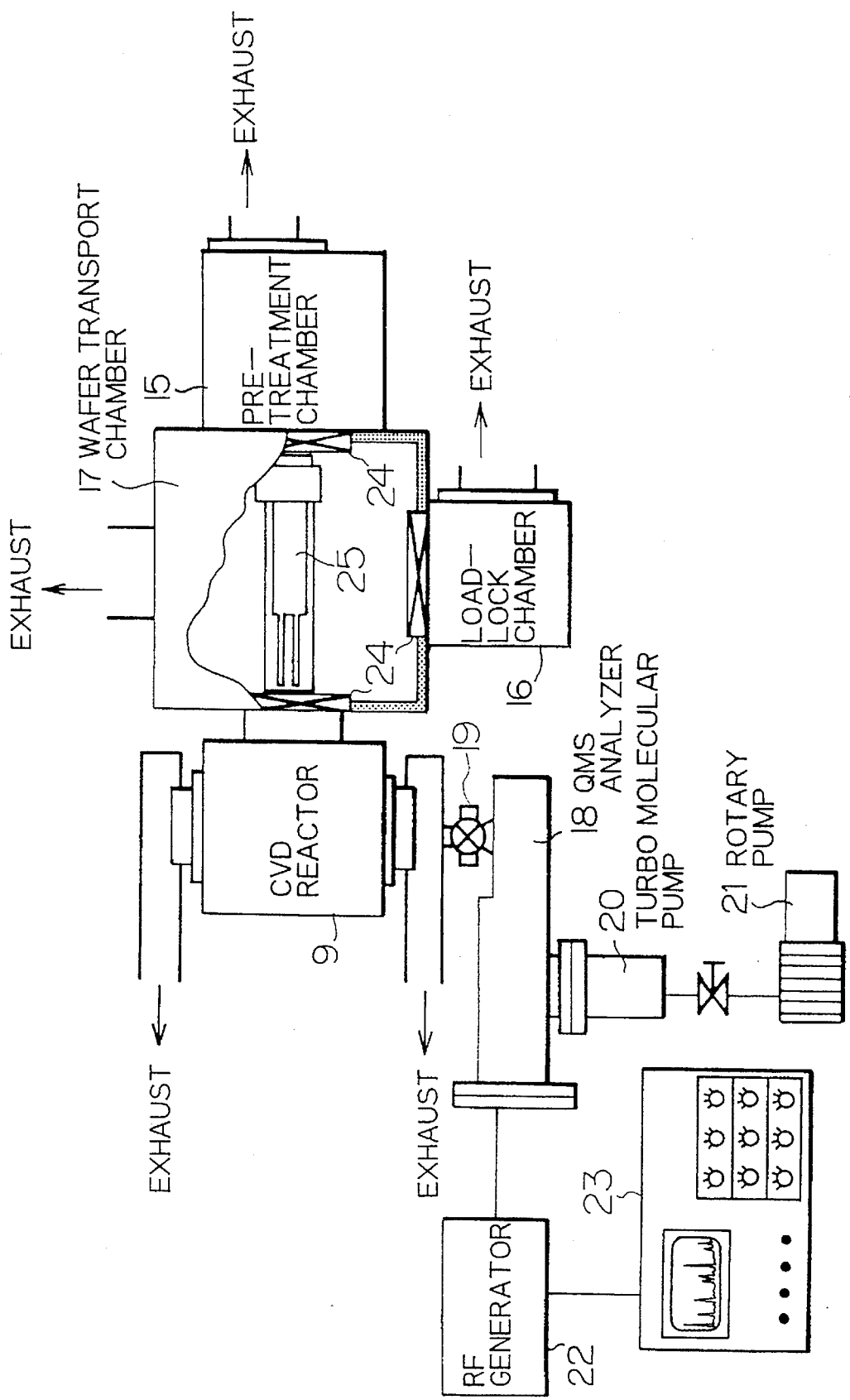

FIG. 25

DEPOSITION CONDITION ON THE ACCELERATED EVALUATION

| THE NUMBER OF TREATED WAFERS | DEPOSITION CONDITION | THE NUMBER OF TREATED WAFERS | DEPOSITION CONDITION |
|---|---|---|---|
| 1 | DEPOSITION ON SiO₂ COVERED WAFER* WF₆/SiH₄/Ar(UPPER)/Ar(LOWER) = 5/4/50/60 (sccm), P = 2.7 Pa, T = 210°C, 2min | 405 | DEPOSITION ON SiO₂ COVERED WAFER |
| 2 – 101 | BLANKET DEPOSITION** Si-REDUCED REACTION WF₆/SiH₄/Ar(UPPER)/Ar(LOWER) = 5/0/50/60 (sccm), P = 2.7 Pa, T = 350°C, 1min SiH₄-REDUCED REACTION WF₆/SiH₄/Ar(UPPER)/Ar(LOWER) = 5/4/50/60 (sccm), P = 2.7 Pa, T = 230°C, 20min | 406 – 505 | BLANKET DEPOSITION |
|  |  | 506 | DEPOSITION ON SiO₂ COVERED WAFER |
|  |  | 507 – 606 | BLANKET DEPOSITION |
|  |  | 607 | DEPOSITION ON SiO₂ COVERED WAFER |
|  |  | 608 – 707 | BLANKET DEPOSITION |
|  |  | 708 | DEPOSITION ON SiO₂ COVERED WAFER |
|  |  | 709 – 808 | BLANKET DEPOSITION |
| 102 | DEPOSITION ON SiO₂ COVERED WAFER | 809 | DEPOSITION ON SiO₂ COVERED WAFER |
| 103 – 202 | BLANKET DEPOSITION | 810 – 909 | BLANKET DEPOSITION |
| 203 | DEPOSITION ON SiO₂ COVERED WAFER | 910 | DEPOSITION ON SiO₂ COVERED WAFER |
| 204 – 303 | BLANKET DEPOSITION | 910 – 1010 | BLANKET DEPOSITION |
| 304 | DEPOSITION ON SiO₂ COVERED WAFER | 1010 | DEPOSITION ON SiO₂ COVERED WAFER |
| 305 – 404 | BLANKET DEPOSITION |  |  |

* EQUIVALENT TO SELECTIVE DEPOSITION OF 0.4μm

** CORRESPONDING TO SELECTIVE DEPOSITION OF 300 WAFERS IN EQUIVALENT W-DEPOSITION, WHEREAS AS FOR THE DEPOSITION TIME IT TOOK THAT OF 10 WAFERS WORTH DEPOSITION

CVD REACTOR APPARATUS

BACKGROUND OF THE INVENTION

The present invention relates to a CVD reactor apparatus for forming CVD thin films on a substrate, and more particularly to a CVD reactor apparatus, suitable for thermal CVD, which can prevent thin films from being formed at portions other than a desired portion on a substrate to reduce the generation of deposition particles to thereby dispense with chamber cleaning, and which can therefore exhibit high throughput and high apparatus operating rate. Further, the present invention is concerned with a CVD reactor apparatus suitable for thermal CVD which can monitor only a reaction on the front of a substrate in a real time manner, can prevent a monitor unit from being damaged by chamber cleaning to permit a stable long-term monitoring operation without deterioration with time and is therefore easily applicable to automated operation to exhibit excellent productivity.

With advancement in high integration of LSI's, the LSI production process has required high-degree techniques. As for the problem that increasing difficulties are encountered in design of wiring for connection between an element and a wiring line or between wiring lines, for instance, the multilayer wiring technique has become indispensable for solving this problem. In this case, a method has been adopted in which, in order to connect lower wiring lines to upper wiring lines overlying the lower wiring lines through an intervening insulating film, fine or minute holes for conduction (hereinafter referred to as through-holes) are formed in the insulating film and the through-holes are filled with electrical conductors.

Methods for filling the through-holes have been known including methods capable of exhibiting good filling capability even when the through-hole diameter is very small. Of these methods, selective CVD (Chemical Vapor Deposition) of metal such as tungsten has been known as the most practical. The CVD of tungsten (hereinafter simply referred to as W) is classified into: a first type in which a film of high covering intimacy is deposited on the whole surface of a substrate through blanket deposition process and used, as it is, for wiring, and a second type in which only through-holes are filled through selective deposition process and a metal material of low resistivity such as Al (aluminum) is deposited to cover the whole surface. The following description will be given by way of the latter type.

Selective CVD of W is a method wherein a mixed gas of tungsten hexafluoride (WF6) and hydrogen ($H_2$) or ($SiH_4$) is introduced onto a specimen substrate heated to 250° C. or more and contacted to the substrate to cause a W-film to grow on an undercoating metal (of aluminum, in this example) through any one of the following reactions:

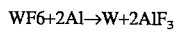

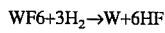

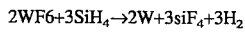   (chemical formula 1).

As an example, a silicon wafer is used as the specimen substrate, an Al pattern is formed to provide an undercoating metal on the wafer surface, an insulating film of, for example, $SiO_2$ is formed on the Al pattern and the insulating film is formed with through-holes to expose the undercoating metal.

In this case, a reaction pursuant to (chemical formula 1) does not take place on the insulating film of $SiO_2$ but W selectively grows on only Al exposed to the inside of the through-holes to fill up the throughholes. A description relevant to this type of selective CVD of W is given in, for example, Journal of Electrochemical Society, Vol. 131 (1984), pp. 1427–1433 and "CVD Technique for VLSI", Report of the First Symposium of the ESC, Japan, 1988, pp. 48–65.

As prior art documents relevent to this kind of technique, one may refer to JP-A-64-17424, JP-A-4-226027, JP-A-4-233221, JP-A-4-268724 and JP-A-4-294526.

On the other hand, with recent advancement in LSI's, the plant investment cost has increased considerably and the production process grows, raising the production cost remarkably. To reduce the production cost, reduction of personnel expenses which results from automation is considered to be effective, and a monitoring technique, indispensable for automation, has been developed. A technique relevant to automation technology for LSI's is described in, for example, "Integrated Processing for Microelectronics Science and Technology", IBM Journal of Research and Development, Vol. 36 No. 2, (1992), p. 233.

The selective CVD method described previously is effective for the formation of fine and multilayer LSI wiring, but a problem is encountered in practicing this method. The problem resides in that selectivity in the aforementioned selective deposition is not always perfect and metal grows on the backside of the wafer. However, the formation of a film on the backside of the wafer is not desired. More particularly, a susceptor provided in a reactor and adapted to heat a wafer is heated to an equal or higher temperature than that of the wafer and hence a film is easily formed on the surface of the susceptor when CVD gas merely comes into contact therewith. In addition, since the backside of the wafer is not covered with an insulating film and an active silicon surface exposed to the backside, a deposition reaction proceeds when the gas contacts the silicon surface. The unwanted film thus formed has in general weak adhesiveness and is liable to peel off, causing the generation of particles and contaminants in a CVD reactor and inviting a reduction in the yield of the treatment process. Further, the problem of formation of the unwanted film is not inherent to the selective CVD and causes the generation of particles and contaminants in the CVD reactor also in blanket CVD, thus reducing the yield.

Therefore, it is becoming a common practice in the latest individual water processing type CVD equipment that every single wafer has its backside etched, backside, and/or that the inside wall of the cold-wall reactor is etched after every single deposition. Chamber cleaning inside the reactor performed before CVD is described in Conf. Proc. of Advanced Metallization for ULSI Applications (1991, N.J. and Tokyo; MRS), pp. 167–172 and 249–253.

However, wherein chamber cleaning inside the reactor is carried out before CVD, the chamber wall and especially such a heated portion as the susceptor are damaged by plasma, raising a new problem that particles resulting from decomposition and alteration, not deposition of the reactor constituent material are generated.

On the other hand, process monitoring techniques for performing automated unattended operation with a view of reducing the production cost have been developed as described previously and the application of a reaction gas monitor, mainly using a mass analyzer or a luminescence analyzer and a wafer temperature monitor using a pyrothermometer, to the CVD process with which the present invention is concerned has been studied. In the conventional CVD reactor, however, film formation takes place at the wafer backside and unwanted portions inside the CVD reactor, making it difficult to accurately monitor reaction on the front side of the wafer (i.e., the element forming side of the wafer). Especially, in the selective CVD, since the reaction area on the wafer front is very small, and the amount of deposition reaction is far larger at the wafer backside and unwanted portions inside the CVD reactor than at the wafer front, monitoring the reaction on the wafer front is substantially impossible. Further, when a pyro-thermometer is used to monitor the wafer temperature, a quartz light guide and an IR (infrared) transparent window are generally used for transmission of infrared light to a detecting portion, as described in JP-A-4-130746. But, in the conventional CVD reactor, the light guide and the IR transparent window are damaged and deteriorated by plasma during chamber cleaning to gradually decrease the transmitivity for infrared light and monitoring of the wafer temperature becomes substantially impossible.

SUMMARY OF THE INVENTION

An object of the present invention is to provide a CVD reactor of high throughput and high operating rate which prevents film formation at the wafer backside and unwanted portions inside the CVD reactor, that is, the present invention dispenses with chamber cleaning. Another object of the present invention is to provide a CVD reactor system which can be operated automatically by connecting a CVD reactor of the present invention with a reaction gas monitor or a wafer temperature monitor and accurately monitoring only a reaction on the wafer front on a real time base to monitor the wafer temperature stably without causing monitoring to change with time during a long-term operation.

To accomplish the above objects, the present invention adopts a first construction wherein in a CVD reactor apparatus for forming a CVD reaction film on the surface of a substrate by using a reactive gas in a reactor, the apparatus has a substrate clamp for dividing a space inside the reactor into a space on the side of the top of the substrate disposed in the reactor and a space on the side of the backside of the substrate and for clamping only a peripheral edge of the substrate top so that most of the substrate top may adjoin the space on the side of the substrate top, a slight gap is formed between the substrate clamp and the peripheral edge of the substrate top so that the space on the side of the substrate top may communicate with the space on the side of the substrate backside through only the gap, gas containing at least a CVD gas is provided in only the space on the side of the substrate top, only a gas such as inert gas, not containing the CVD gas, so as not to participate in deposition is filled up in the space on the substrate backside at a higher pressure than that in the space on the substrate top, the gas such as insert gas not containing the CVD gas so as not to participate in deposition and provided in the space on the substrate backside is passed through the gap to the space on the substrate top maintained at a lower pressure to prevent the CVD gas from contacting the substrate backside and the substrate top peripheral edge, means for heating the substrate to a desired temperature is provided, and cooling means such as watercooling is used to maintain the surface temperature of the reactor inner wall on the side of the substrate top and being in contact with the CVD gas, except the substrate top, at a deposition lower limit temperature or less.

To accomplish the above objects, the present invention adopts a second construction wherein in a CVD reactor apparatus for forming a CVD reaction film on the surface of a substrate by using a reactive gas, the apparatus has gas introduction means for supplying the reactive gas to the top of the substrate through a space adjoining the top of the substrate, a ring-shaped or a frame-shaped substrate clamp for clamping a peripheral edge of the substrate so that most of the substrate top may be exposed, substrate clamp move means for moving the substrate clamp vertically, a plurality of lift pins fixed to the substrate clamp and operative to engage the backside of the substrate externally thereof for suspending and lifting the substrate, a ring-shaped or frame-shaped stopper disposed beneath the substrate clamp and being in contact with the substrate clamp to surround the substrate externally thereof, seal means for sealing, in an airtight manner, a contact portion between the substrate clamp and the stopper, a plurality of spring-shaped substrate susceptor pins fixed to the inner side of the stopper and operative to push up the substrate at its backside by force which does not damage the substrate and flex downwards by themselves when the substrate is pushed down by the substrate clamp, and inert gas supply means for supplying an inert gas to a space on the side of the backside of the substrate, the space being surrounded by the inner wall of the stopper, the lower surface of the substrate clamp and the bottom of the reactor, to prevent the reactive gas from flowing to the substrate backside, whereby the substrate transported from the outside of the reactor is supported in the reactor and deposition is carried out by limiting an area of CVD deposition by the reactive gas to only the substrate top except the peripheral edge of the substrate.

To accomplish the above objects, the present invention adopts a third construction wherein in the second construction, the temperature at surfaces in contact with the reactive gas, including the reactor inner wall, the surface of the gas introduction means and the upper surface of the substrate clamp, but excluding the substrate top, is maintained at a deposition reaction lower limit temperature or less by cooling means such as water cooling.

To accomplish the above objects, the present invention adopts a fourth construction wherein in the first construction, the means for heating the substrate provides direct irradiation of radiation light from a heating light source, such as a lamp disposed exterior to of the CVD reactor, through a transparent window.

To accomplish the above objects, the present invention adopts a fifth construction wherein in the first construction, the means for heating the substrate has a susceptor irradiated and heated by radiation light from a heating light source such as a lamp disposed exterior to the CVD reactor through a transparent window, the susceptor being disposed on the side of the substrate backside in contact with the substrate to provide heat conduction and heat radiation from the susceptor.

To accomplish the above objects, the present invention adopts a sixth construction wherein in the fifth construction, the susceptor is larger in size than the substrate, is formed with cuttings for preventing the susceptor from contacting the substrate lift pins during vertical movement of the substrate lift pins so that only the substrate may be lifted by the lift pins, and is carried on the substrate susceptor pins.

To accomplish the above objects, the present invention adopts a seventh construction wherein in the first construction, the means for heating the substrate includes a heater stage disposed on the side of the substrate backside in contact with the substrate and heated by resistive heating to provide heat conduction and heat radiation to the substrate.

To accomplish the above objects, the present invention adopts an eighth construction wherein in the seventh construction, the heater stage is larger in size than the substrate, is formed with cuttings for preventing the heater stage from contacting the substrate lift pins during vertical movement of the substrate lift pins so that only the substrate may be lifted by the lift pins, and is carried on the substrate susceptor pins.

To accomplish the above objects, the present invention adopts a ninth construction wherein in the first or second construction, the CVD reactor is connected to another process reactor.

To accomplish the above objects, the present invention adopts a tenth construction wherein in the first or second construction, the CVD reactor is connected to a reaction gas monitor and the system functions to monitor only a reaction on the substrate top.

To accomplish the above objects, the present invention adopts an eleventh construction wherein in the first or second construction, the CVD reactor is connected to a substrate temperature monitor and the system functions function to monitor the temperature of the substrate without causing the substrate temperature monitor to change with time.

To accomplish the above objects, the present invention adopts a twelfth construction wherein in the first or second construction, the CVD reactor is connected to a reaction gas monitor and a substrate temperature monitor and the system functions to monitor only a reaction on the substrate top and a substrate temperature without causing the substrate temperature monitor to change with time.

To accomplish the above objects, the present invention adopts a thirteenth construction wherein in the tenth or twelfth construction, the reaction gas monitor connected to the CVD reactor includes a gas inlet for introducing part of gas prevailing in the CVD reactor and a mass analyzer exhausted differentially.

To accomplish the above objects, the present invention adopts a fourteenth construction wherein in the eleventh or twelfth construction, the substrate temperature monitor connected to the CVD reactor includes a light guide for receiving, at one end surface, infrared light radiated from the substrate backside and transmitting it to the other end surface, and calculation means for picking up the infrared light to detect the intensity thereof and calculating the temperature of the substrate the detection results.

To accomplish the above objects, the present invention adopts a fifteenth construction wherein in the eleventh or twelfth construction, the substrate temperature monitor connected to the CVD reactor includes a transparent window for isolating the inside of the CVD reactor from atmosphere and delivering infrared light radiated from the substrate backside to the outside of the CVD reactor, a collection lens for collecting the infrared light transmitting through the transparent window, and calculation means for picking up the infrared light to detect the intensity thereof and calculating the temperature of the substrate from detection results.

According to the first construction, since a CVD film can be grown highly selectively at only a desired portion on the top of the wafer such as a silicon wafer, defects attributable to particles resulting from film peel-off occurring throughout the deposition procedure can be reduced considerably in a process for filling fine connection holes such as through-holes through CVD process. Further, there is no need of performing chamber cleaning before CVD treatment and therefore the throughput can be improved and the generation of contaminants from the chamber can also be reduced to permit a long-term continuous operation, thereby improving the operating rate.

According to the second construction, in order to prevent a decrease in selectivity, the flow path for supplying gas to the backside and side surface of the wafer and the edge of the wafer top for which deposition is not required is separated from the flow path for supplying gas to the wafer front for which deposition is required, only the wafer is maintained at a temperature for causing CVD reaction or more, and reactive gas being about to go around the wafer side surface toward the wafer backside is purged by inert gas prevailing on the side of the wafer backside so as to be prevented from adsorbing to the wafer side surface and backside, whereby CVD reaction gas such as WF6 or $SiH_4$ flowing to the wafer front is substantially allowed to be adsorbed to only a wafer front portion which is inside the wafer clamp adapted to fix the wafer edge.

According to the third construction, portions other than the wafer are not maintained at a temperature for causing CVD reaction and consequently, the CVD reaction takes place at only a desired area on the wafer front, but does not take place at the wafer edge and the reactor inner surface. This implies that unwanted CVD reaction is suppressed to improve the selectivity in the blanket deposition as compared to the conventional technique.

In the fourth construction, light is irradiated directly on the wafer and adjustment of the optical system such as a lamp is difficult to achieve for the sake of making the temperature distribution in the wafer uniform, but instead, the wafer temperature during processing can be changed at a high response.

In the fifth or sixth construction, the heating means includes heat conduction and heat radiation from the susceptor disposed on the side of the wafer backside in contact with the wafer and irradiated and heated through the transparent window by radiation light from the heating light source such as a lamp disposed exteriorly of the CVD reactor and therefore, with the susceptor used, the temperature is difficult to change, but the temperature distribution can be uniformed relatively easily.

In the seventh or eighth construction, the heating means includes heat conduction and heat radiation from the heater stage disposed on the side of the wafer backside in contact with the wafer and heated by resistive heating and therefore, with the heater stage used, the temperature is difficult to change, but the temperature distribution can be uniformed relatively easily.

According to the ninth construction, wafers can be transported to a plurality of processing chambers such as pretreatment chambers, thus contributing to combination and continuous automation of the thin film deposition procedures which will be needed in the future.

According to the tenth or thirteenth construction, since portions other than the wafer are not maintained at a temperature for causing CVD reaction and the CVD reaction is allowed to take place at only a desired area on the wafer front, information about reaction progression monitoring which an object to be monitored needs for device production can be obtained and process condition control on a real time basis and quality of product wafers can be ensured to reduce irregularity in working during processing, thus promoting automated operation and contributing to improvement in productivity.

According to the eleventh, fourteenth or fifteenth construction, since unwanted film formation does not occur at portions other than the wafer front and there is no need to perform chamber cleaning, the temperature of the substrate can be monitored without causing parts of the temperature monitor to be deteriorated by plasma and changed with time, and process condition control on a real time basis and quality of product wafers can be ensured to reduce irregularity in working during processing, thus promoting automated operation and contributing to improvement in productivity.

According to the twelfth construction, reaction progression monitoring and temperature can be monitored simultaneously and therefore more precise process condition control on a real time basis and quality of product wafers can be ensured to reduce irregularity in working during processing, thus promoting automated operation and contributing to improvement in productivity.

BRIEF DESCRIPTION OF THE DRAWINGS

FIG. 11 is a schematic diagram showing connection of a CVD apparatus and a QMS system in a CVD system according to the present invention.

FIG. 25 is a diagram for explaining details of deposition conditions and the flow of wafers.

DESCRIPTION OF THE PREFERRED EMBODIMENTS

The present invention will now be described by way of example with reference to the accompanying drawings.

[Embodiment 1]

Figure 1:
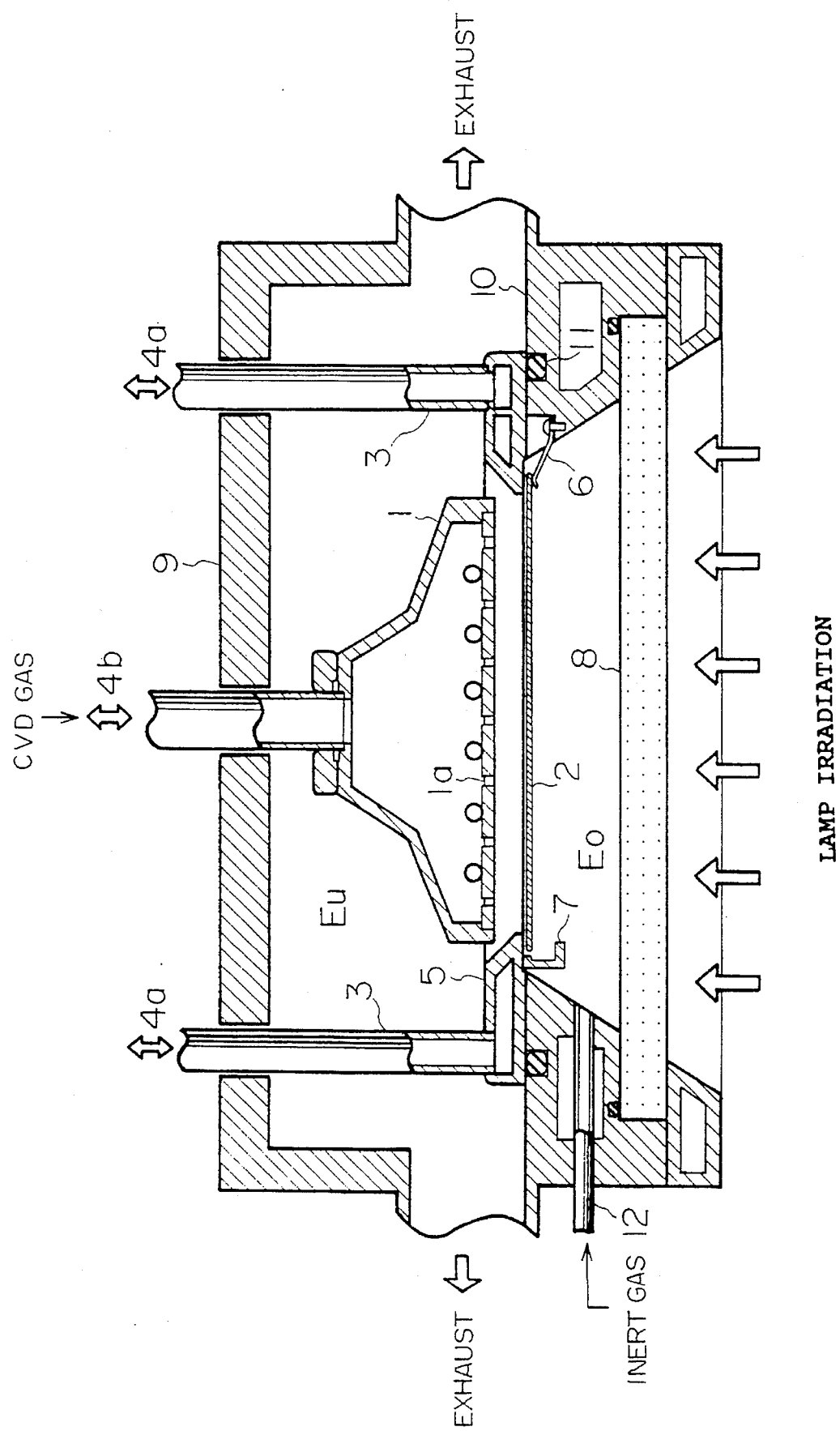
FIG. 1 is a sectional view showing a first embodiment of a CVD reactor apparatus according to the present invention.

FIG. 1 shows the cross section of the CVD reactor where some of the major components are shown. This reactor employs lamps as the radiation heating means.

As shown in FIG. 1, a silicon wafer 2 is used as a substrate and the wafer 2 is loaded face-up inside a CVD reactor (reaction chamber) 9, having its upper peripheral edge clamped by a ring-shaped wafer clamp 5 and its lower peripheral edge fixed on three wafer susceptor pins 6 to be described later.

A gas shower head 1 provided with a cooling water mechanism has blow-off holes 1a through which a CVD gas is sprayed on the wafer 2, the CVD gas being then exhausted through an exhaust port.

Lifting rods 3 are fixed at the upper surface of wafer clamps. The wafer lifting rods 3 can be moved vertically by means of an elevator 4a of wafer lift rod (4b designates an elevator of the gas shower head and both of the elevators are not illustrated in the drawing). The wafer clamp 5 is mounted with three wafer lift pins 7 and by lifting the wafer clamp 5, the wafer is lifted upwards along with the wafer clamp 5 while being carried on the lift pins 7.

The wafer susceptor pin 6 is made of a spring material and is fixed to a bottom ring 10 of CVD reactor which serves also as a stopper when the wafer clamp 5 descends downwards. An O-ring seal 11 is disposed in a contact surface between the reactor bottom ring 10 and the wafer clamp 5 to maintain the airtightness of the contact surface.

A heating light source, not shown, is arranged exterior to and downward of the reactor 9, and the wafer 2 is heated under the irradiation of light by means of the heating light source through a quartz window 8 disposed at a lower portion of the reactor 9.

A space Eo is defined by being surrounded by the backside of the wafer 2, the lower surface of the wafer clamp 5 and the inner surfaces of the quartz window 8 and the reactor bottom ring 10 also serving as the stopper, and an inlet 12 of inert gas is provided to fill up the space EO with inert gas.

Next, the susceptor of the wafer 2 will be described.

Figure 2:
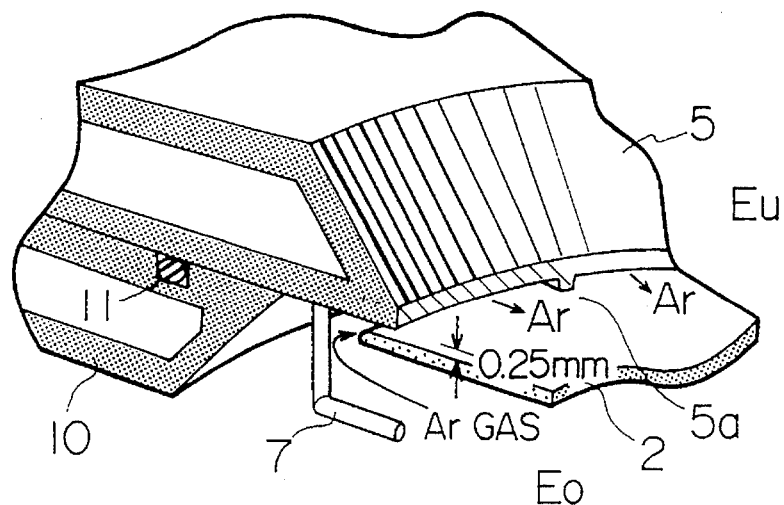
FIG. 2 is a fragmentary sectional perspective view showing the positional relation among a wafer lift pin, a wafer clamp and a wafer in a purge gas flow path in the first embodiment of CVD reactor apparatus.
Figure 3:
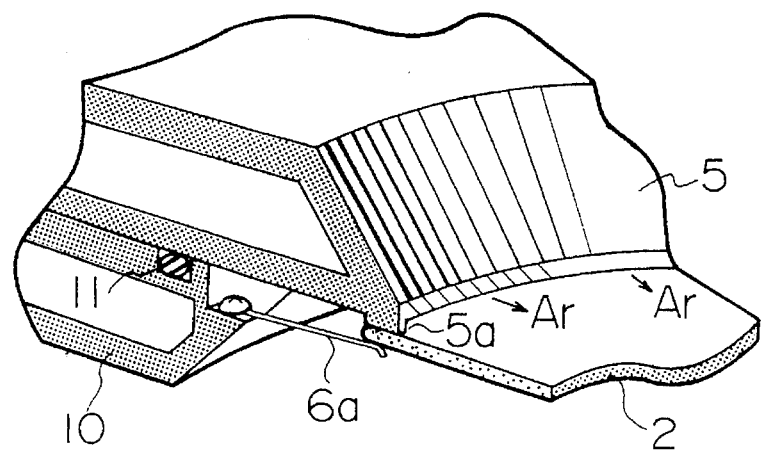
FIG. 3 is a fragmentary sectional perspective view showing the positional relation among a wafer susceptor pin, the wafer clamp and the wafer in the purge gas flow path in the first embodiment of CVD reactor apparatus.

FIGS. 2 and 3 show a purge gas flow path in the first CVD reactor apparatus (based on direct light irradiation), with FIG. 2 being a fragmentary sectional perspective view showing the positional relation among the wafer lift pin 7, wafer clamp 5 and wafer 2 and FIG. 3 being a fragmentary sectional perspective view showing the positional relation among the wafer susceptor pin 6a, wafer clamp 5 and wafer 2.

In order to insure high selectivity, CVD reactions which might take place at sites other than the front of the wafer must be suppressed as described previously. To this end, the backside of the wafer 2 is purged by inert Ar gas to suppress intrusion of the CVD gas to the backside of the wafer 2 and a resulting growth of a film thereat. In the illustration, the wafer lift pins 7 are welded to the wafer clamp 5 so as to be integral therewith.

The O-ring seal 11 is disposed in the reactor bottom ring 10 at a position which comes into contact with the wafer clamp ring 5 and consequently the sealing properties between the space Eo on the side of the backside of the wafer 2 and a space Eu (FIG. 1) on the side of the front of the wafer 2 can be improved. Then, as shown in FIGS. 2 and 3, a flow path for purge Ar gas is limited to a gap d (for example, 0.25 mm) set up between the wafer and wafer clamp by projections 5a provided on the wafer clamp ring 5 to decrease the probability that the CVD gas fed to the space on the side of the front of the wafer 2 will go round the wafer 2 toward the backside thereof. This effect will be described in connection with evaluation results.

Figure 4:
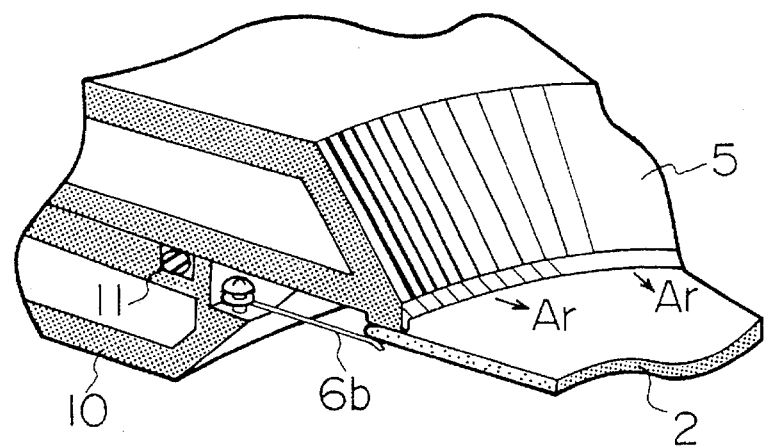
FIG. 4 is a fragmentary sectional perspective view showing the positional relation among a wafer susceptor pin different from that of FIG. 3, the wafer clamp and the wafer.

FIG. 4 shows a modified example different from FIG. 3 and in this Figure being a fragmentary sectional perspective view showing the positional relation among the wafer lift pin, wafer clamp and wafer, reference numeral 6b designates wafer susceptor pins and the remainder of construction is the same as that of the aforementioned embodiment.

Instances different from the previously-described heating method based on direct light irradiation onto the wafer 2, that is, a second embodiment of CVD reactor apparatus using a wafer susceptor and a third embodiment of CVD reactor apparatus using a heater stage, are shown in FIGS. 5 to 7 and FIGS. 8 to 10, respectively, and these embodiments are identical to FIG. 1 with the only exception being that the heating means is different.

Figure 5:
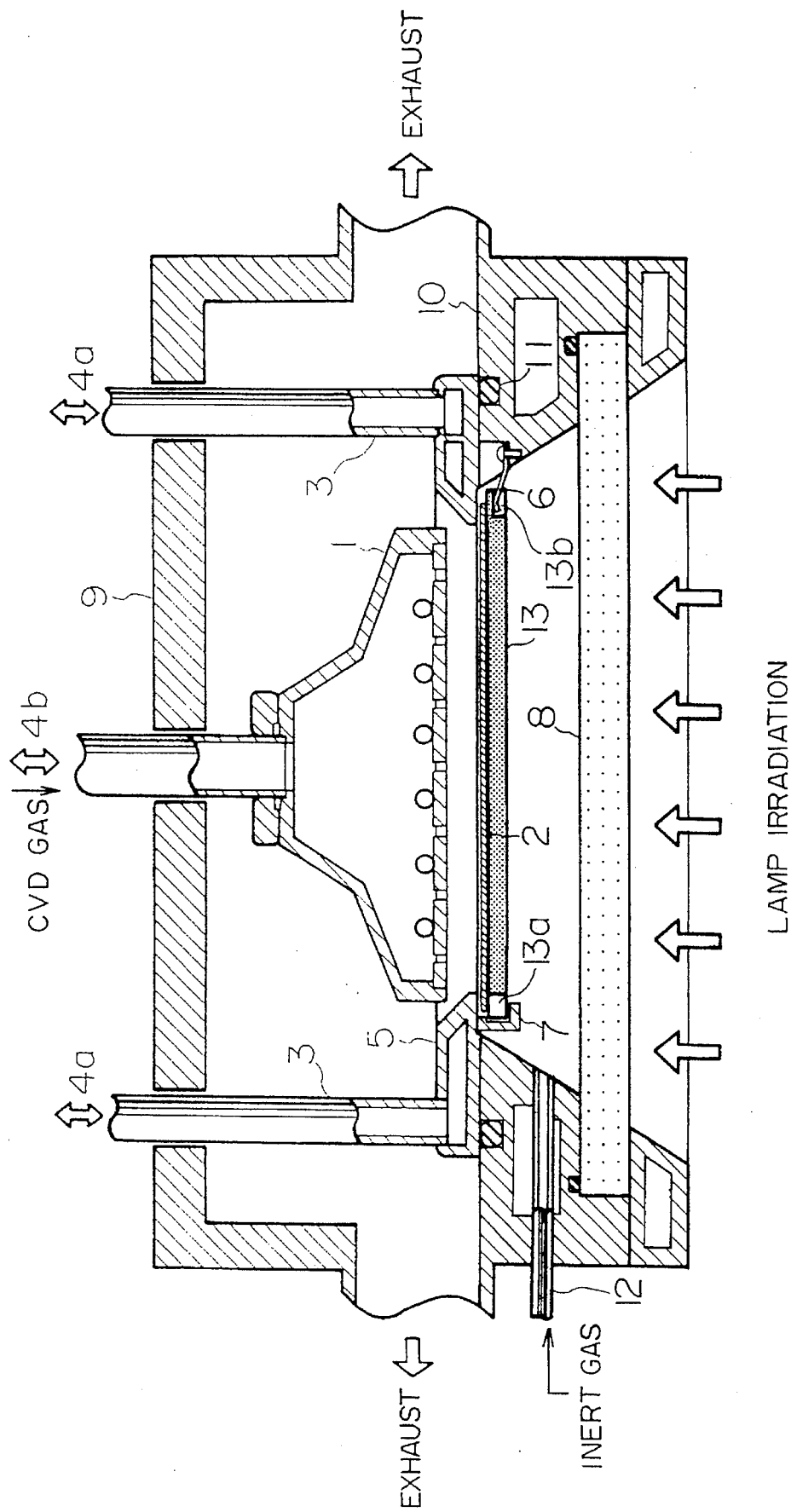
FIG. 5 is a sectional view showing a second embodiment of the CVD reactor apparatus according to the present invention.
Figure 6:
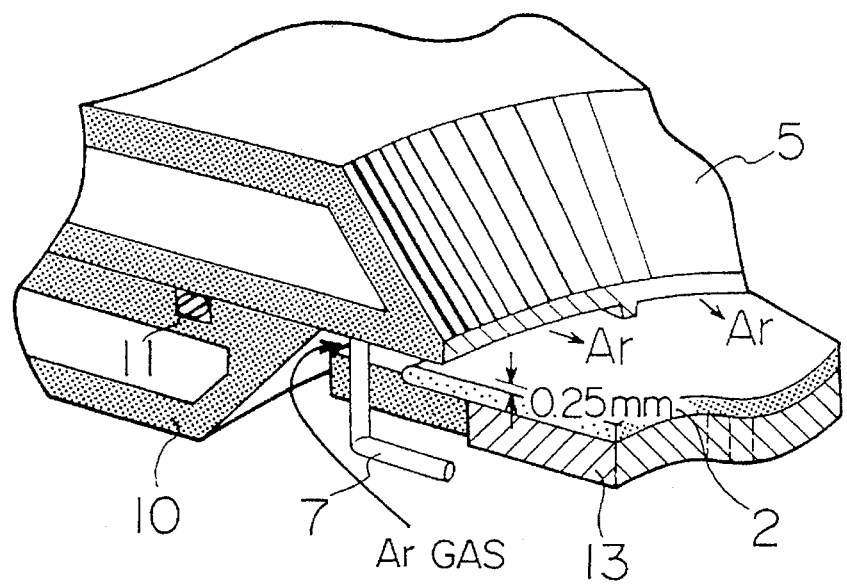
FIG. 6 is a fragmentary sectional perspective view showing the positional relation among a wafer lift pin, a wafer clamp and a wafer in a purge gas flow path in the second embodiment of CVD reactor apparatus.
Figure 7:
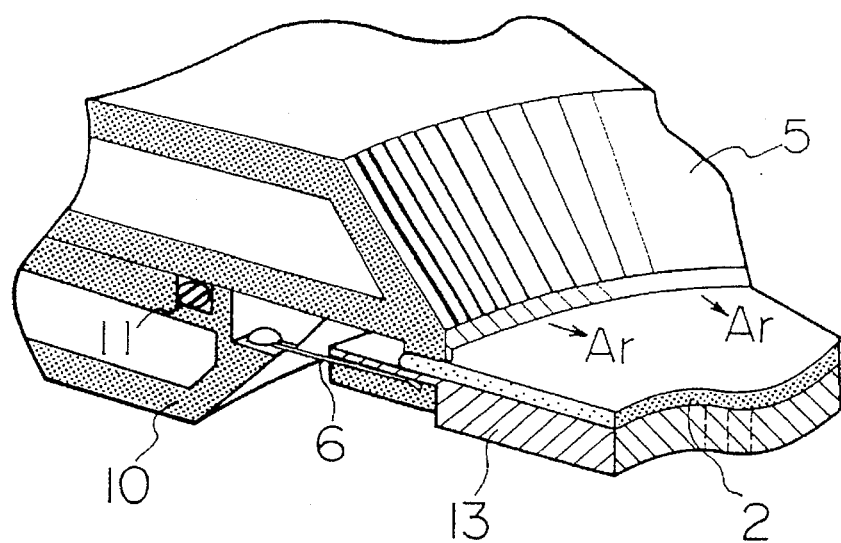
FIG. 7 is a fragmentary sectional perspective view showing the positional relation among a wafer susceptor pin, the wafer clamp and the wafer in the purge gas flow path in the second embodiment of CVD reactor apparatus.

FIG. 5 shows the second CVD reactor apparatus and FIGS. 6 and 7 show a purge gas flow path in the second CVD reactor apparatus (based on susceptor light irradiation), with FIG. 6 being a fragmentary sectional perspective view showing the positional relation among the wafer lift pin 7, wafer clamp 5 and wafer 2 and FIG. 7 being a fragmentary sectional perspective view showing the positional relation among the wafer susceptor pin 6, wafer clamp 5 and wafer 2.

In these Figures, a wafer susceptor 13 is heated by being irradiated with light radiated from a heating light source, such as a lamp disposed exterior to the CVD reactor 9, through the quartz window 8. The susceptor 13 is attached to the backside of the wafer 2 so as to come in contact with the wafer 2 so that heat may be conducted and radiated from the susceptor 13 to the wafer 2. The susceptor 13 is larger in size than the wafer 2 and is formed with cuttings 13a in the wafer susceptor which prevent the susceptor 13 from contacting the wafer lift pins 7 during vertical movement of the wafer lift pins 7, thereby ensuring that only the wafer 2 can be lifted by means of the wafer lift pins 7. The susceptor 13 is carried on the wafer susceptor pins 6 at recesses 13b in the wafer susceptor. The remainder of construction is identical to that of the first CVD reactor apparatus.

Figure 8:
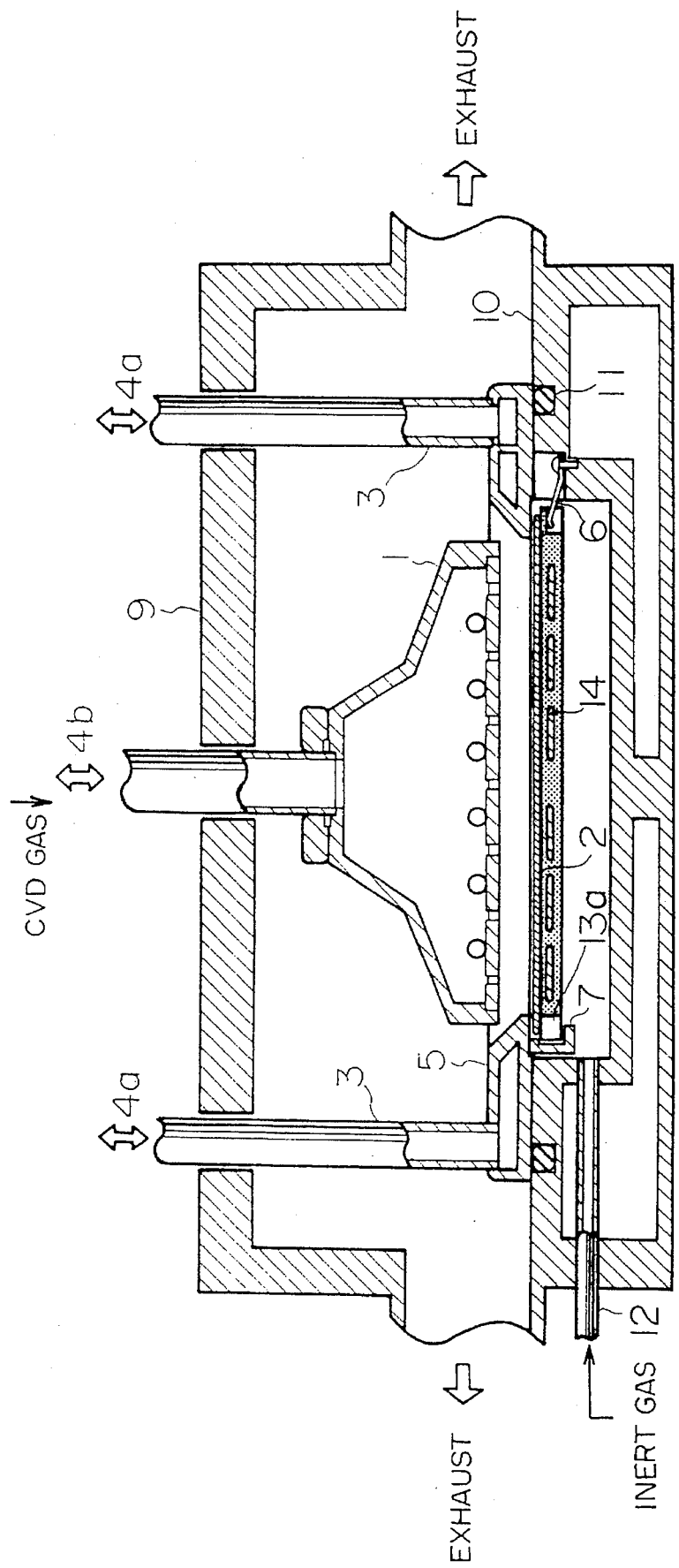
FIG. 8 is a sectional view showing a third embodiment of the CVD reactor apparatus according to the present invention.
Figure 9:
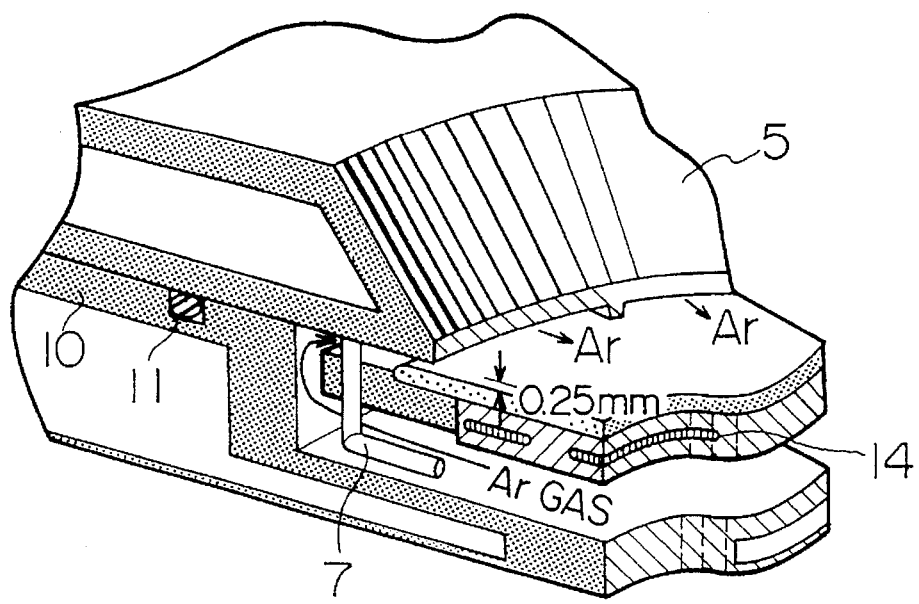
FIG. 9 is a fragmentary sectional perspective view showing the positional relation among a wafer lift pin, a wafer clamp and a wafer in a purge gas flow path in the third embodiment of CVD reactor apparatus.
Figure 10:
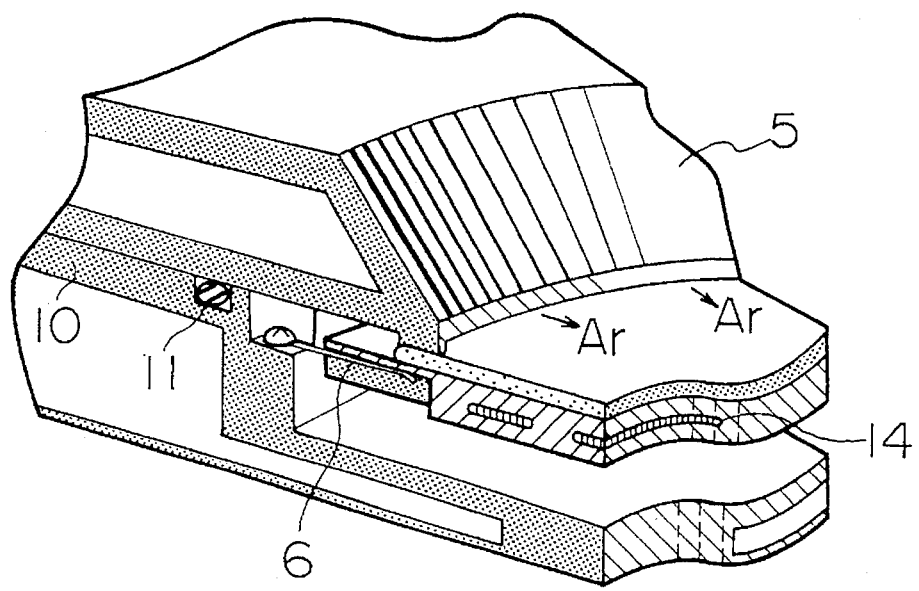
FIG. 10 is a fragmentary sectional perspective view showing the positional relation among a wafer susceptor pin, the wafer clamp and the wafer in the purge gas flow path in the third embodiment of CVD reactor apparatus.

FIG. 8 is a diagram for explaining the third CVD reactor apparatus and FIGS. 9 and 10 show a purge gas flow path in the third CVD reactor apparatus (having heater stage) shown in FIG. 8, with FIG. 9 being a fragmentary sectional perspective view showing the positional relation among the wafer lift pins 7, wafer clamp 5 and wafer 2 and FIG. 10 being a fragmentary sectional perspective view showing the positional relation among the wafer susceptor pin 6, wafer clamp 5 and wafer 2.

In these Figures, a heater stage 14 is heated by, for example, resistive heating. The heater stage 14 is mounted to the backside of the wafer 2 so as to come in contact with the wafer 2 so that heat may be conducted and radiated from the heater stage 14 to the wafer 2. The heater stage 14 is larger in size than the wafer 2, and is formed with cuttings 13a which prevent the heater stage from contacting the wafer lift pins 7 during vertical movement thereof in order that only the wafer 2 can be lifted by means of the wafer lift pins 7. In the case of the third CVD reactor apparatus, no quartz window is provided in contrast to the first and second CVD reactor apparatus and the bottom of reactor 9 is closed. The remainder the construction is identical to that of the first CVD reactor apparatus.

The CVD reactor apparatus of the present invention is used to carry out the process for selective deposition of W film in only through-holes in the wafer 2 (FIG. 12A) and the process for blanket deposition over the entire wafer top (FIG. 12B) as will be described below.

Figure 12A:
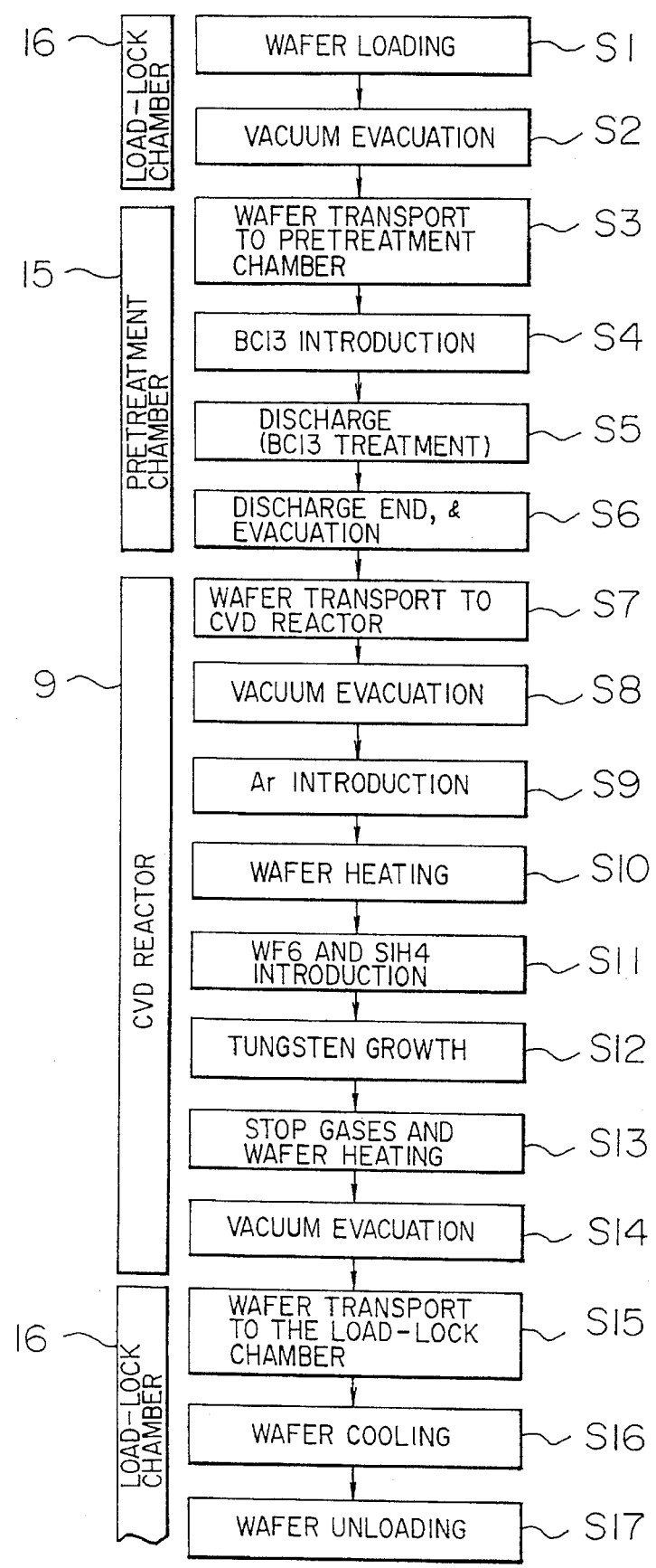
FIG. 12A is a process chart showing an embodiment of selective CVD according to the present invention.
Figure 12B:
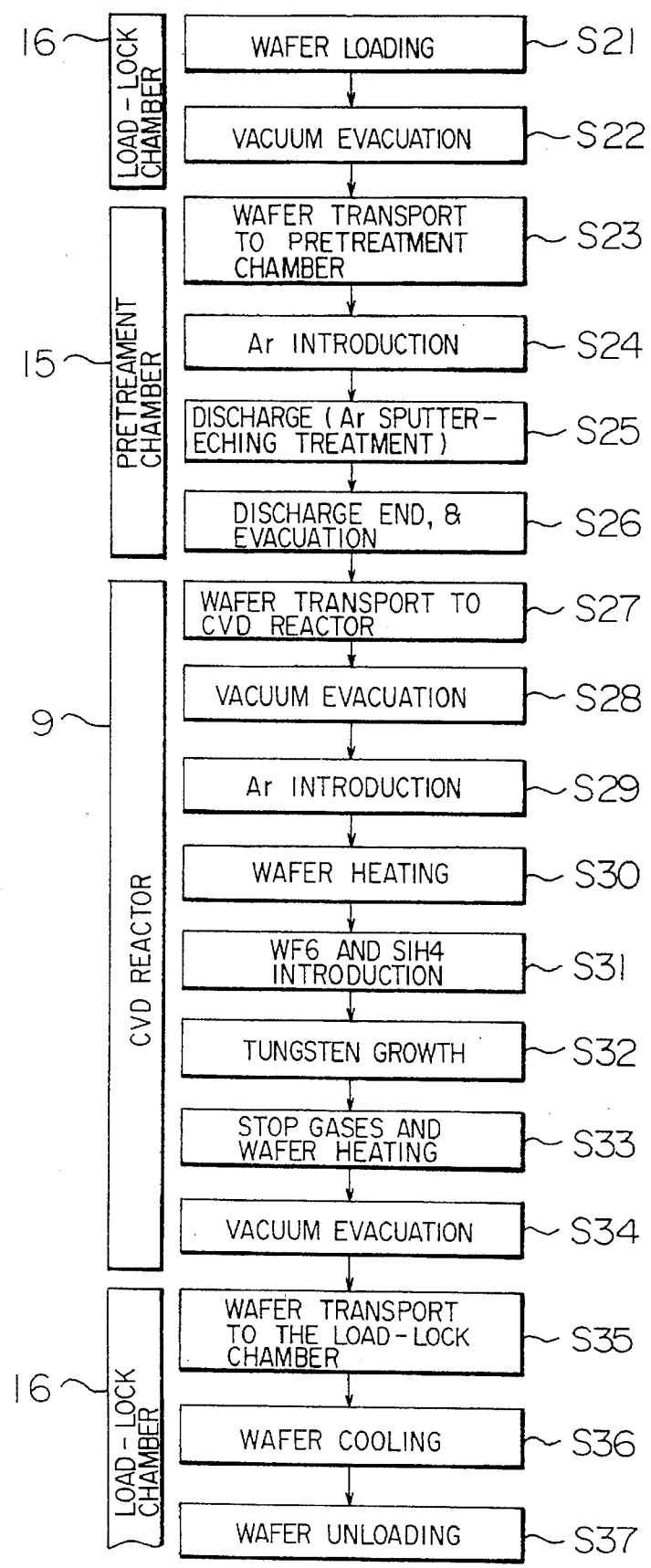
FIG. 12B is a process chart showing an embodiment of blanket CVD according to the present invention.
Figure 13:
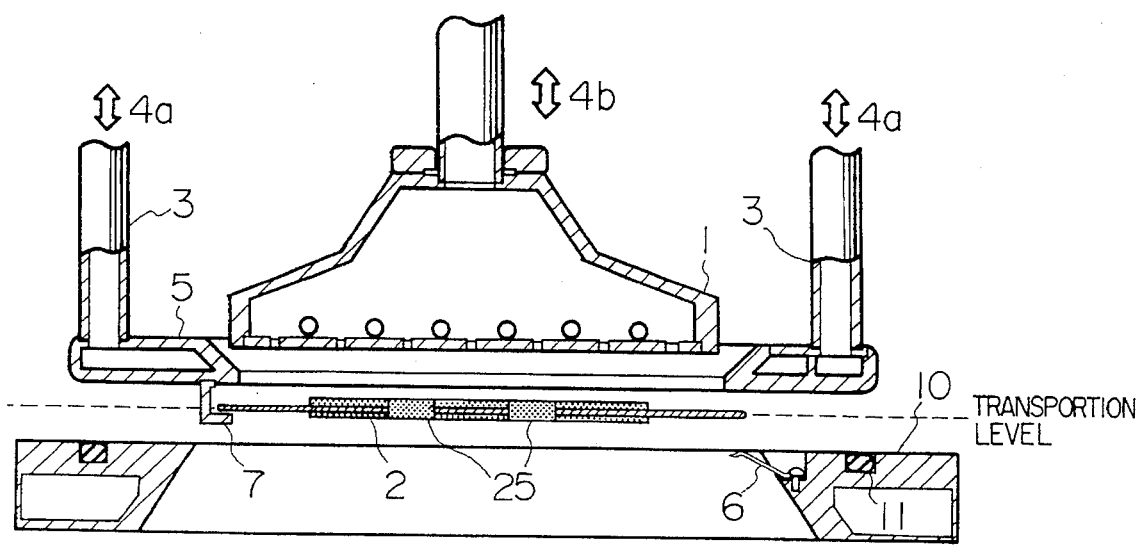
FIG. 13 is a diagram useful to explain a transport method in the CVD apparatus of the invention, showing a state in which a wafer fork is inserted in the CVD reactor.
Figure 14:
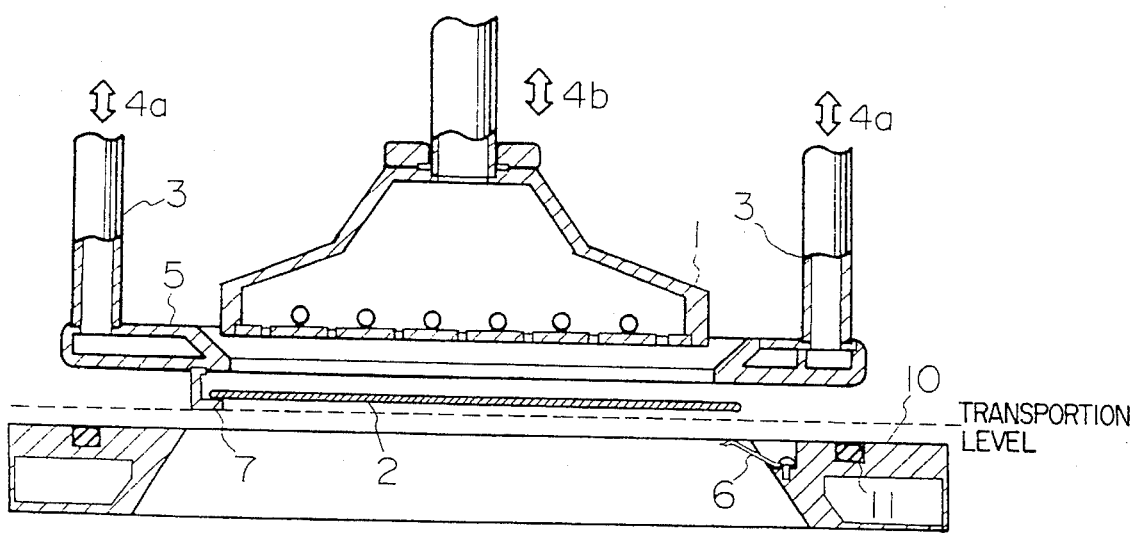
FIG. 14 is a diagram useful to explain the transport method in the CVD apparatus of the invention, showing a state in which a wafer is lifted.
Figure 15:
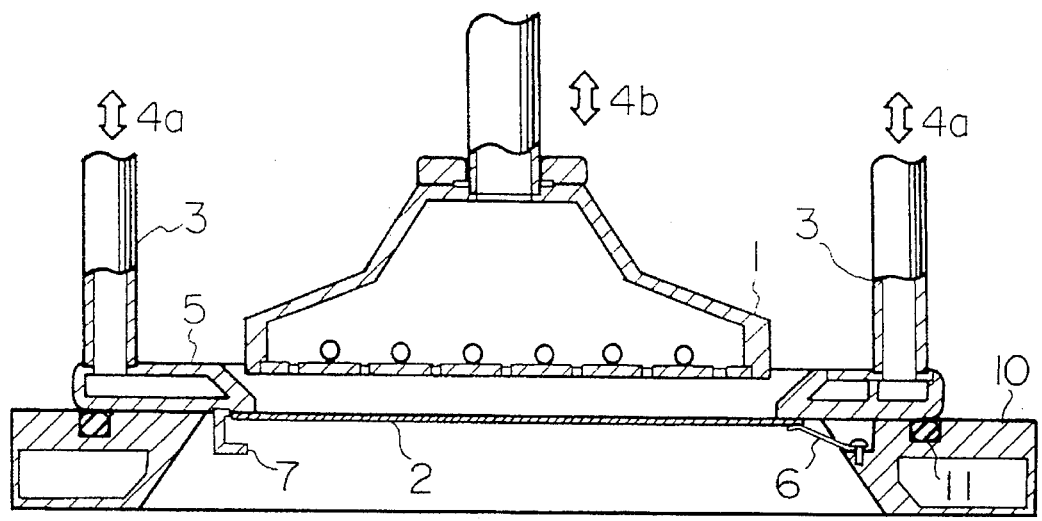
FIG. 15 is a diagram useful to explain the transport method in the CVD apparatus of the invention, showing a state in which the wafer is lowered during CVD or before or after CVD.

FIG. 11 is a diagram for explaining an embodiment of a CVD reactor system which is used for experiments, FIG. 12A is a process chart for selective deposition of W film in only through-holes in the wafer 2, FIG. 12B is a process chart for blanket deposition over the entire top of wafer 2 and FIGS. 13 to 15 are diagrams for explaining the positional relation of the elevator in the CVD reactor 9 upon transport of the wafer 2 during the deposition procedures.

As shown in FIG. 11, the CVD reactor system has a central wafer transport chamber 17, which is being associated with a frontal load-lock chamber 16, a right hand pre-treatment chamber 15 and a left hand CVD chamber (CVD reactor) 9 through gate valves 24. The CVD reactor 9 is provided with a QMS analyzer 18 capable of monitoring reaction gas. Reference numeral 19 designates a conductance control valve, 20 a turbo molecular pump, 21 a rotary pump, 22 an RF generator, 23 a QMS power supply, and 25 a wafer fork.

Referring to FIGS. 12A and 12B, before performing deposition, a pre-treatment is first carried out in the pre-treatment chamber 15 provided adjacent to the CVD reactor 9. This pre-treatment is for cleaning the front of a wafer 2. More specifically, this pre-treatment is effected to reduce contact resistance between Al wiring and W wiring by removing a native oxidized film of Al and to prevent deposition of W film on an insulating film by removing or stabilizing metallic contaminants and active points existing on the surface of the insulating film. In the pre-treatment of FIG. 12A, the above purpose is accomplished by treating a wafer with a halogen gas or plasma of BCl3 herein (S1 to S6). On the other hand, in blanket CVD, this is accomplished by treating a wafer 2 with plasma of Ar gas alone because there is no need to particularly take selectivity into consideration (S21 to S26). After the pre-treatment, the wafer 2 is transported to the CVD reactor 9 without being exposed to atmosphere (S7; S27).

Next, a method of receiving the transported wafer 2 in the CVD reactor and fixing it therein will be described.

Firstly, as shown in FIG. 13, a wafer 2 carried on the wafer fork 25 is horizontally transported at a transportation level L from the pre-treatment chamber 15 into the reaction chamber (CVD reactor) 9. Subsequently, as shown in FIG. 14, the gas shower head 1 and wafer lifting rods 3 are lifted using the elevators 4a and 4b, so that the wafer 2 is lifted to be above the transportation level L while being supported at part of the edge of the wafer 2 by means of the wafer lift pins 7. Then, the wafer fork 25 can be returned to a predetermined position which is outside of the reaction chamber 9. Thereafter, as shown in FIG. 15, the gas shower head 1 and wafer lifting rods 3 are lowered, so that the wafer 2 is carried on the wafer susceptor pins 6. As the wafer lifting rods 3 are lowered, the wafer is placed onto the susceptor pins 6. Further as the gas however is lowered, the wafer is sandwiched between the wafer clamping ring 5 and susceptor pins 6 with the edge of the wafer 2 being supported softly with their spring-like mechanical behavior, so that the wafer is rigidly held in the reactor chamber. As an illustration a test wafer prepared by forming Al wiring on a Si wafer, is used as wafer 2 depositing an insulating film ($SiO_2$) on the Al wiring through, for example, plasma CVD and forming many through-holes of 0.5 µm diameter (1.2 µm depth) through photoetching process.

After the wafer 2 is loaded fixedly, the interior of the reactor 9 is vacuum evacuated sufficiently (S8), Ar gas standing for an inert gas is introduced through the inert gas inlet 12 and gas shower head 1 shown in FIG. 1 at flow rates of 50 sccm and 60 sccm, respectively (S9). Pressure in the reaction chamber 9 is maintained at 2.7 Pa by adjusting the evacuation amount. As described previously, the Ar gas is used for the purpose of preventing a reactive gas from contacting the side surface and backside of the wafer 2 and diluting the reactive gas to improve the uniformity of film thickness on the front of the wafer 2.

Next, the heating light source is turned on to heat the wafer 2 to 230° C. (S10) and thereafter WF gas and $SiH_4$ gas, serving as the reaction gas, are sprayed on the wafer at flow rates of 5 sccm and 4 sccm, respectively, through gas shower head (S11). In this manner, W-films are selectively deposited in only through-holes in the wafer 2 (S12) to fill up the through-holes. In spite of the fact that the side surface and backside of the wafer 2 used in the present embodiment are Si exposing active surfaces on which W-films are normally deposited, it has been proven that in the present embodiment, no W-films are deposited on the side surface and backside of the wafer 2. Also, the condition of the wafer front has been observed with a scanning electron microscope (SEM) to confirm that W is satisfactorily embedded in the through-holes and no particles of W are observed on the insulating film to prove very excellent selectivity.

The performance of the CVD reactor apparatus according to the present invention was evaluated and the performance evaluation will be described.

In an effort to examine the level at which the deposition on only the front of the wafer 2 featuring the CVD reactor apparatus of the present invention is practically carried out, the following performance evaluations were conducted.

(1) Evaluation of the Amount of Reaction in the Reactor of the Present Invention.

The CVD reaction amount at portions other than the wafer 2 was evaluated using the QMS analyzer 18 shown in FIG. 11.

In blanket deposition, a bare Si-wafer was used as a sample and in selective deposition, a wafer with throughholes described as above was used as a sample. Deposition conditions were the same for the two wafers. Further, a Si wafer having SiO₂ formed over the entire surface by thermal oxidation was used as a wafer on which no deposition was effected. The SiO₂ surface formed by thermal oxidation has no surface defect and in principle, deposition never takes place on any portions of the wafer surface. Therefore, if the QMS analyzer 18 detects a reaction, this component can be considered to be due to a reaction at a portion other than the wafer front.

In the selective deposition, a plasma treatment was carried out at 150 W for 3 minutes in the pre-treatment chamber 15 under conditions of BC13/Ar=5/100 sccm (indicating that the flow rates were 5 sccm and 100 sccm for BC13 and Ar, respectively) and 1.3 Pa. But, unless a heat treatment is further practiced after the pre-treatment by BC13, the deposition lag time will increase. Accordingly, the wafer was placed in the CVD chamber 9 and heat treated at 350° C. for 3 minutes and thereafter CVD was practiced. To insure selectivity, WF6 was allowed to flow 5 seconds earlier than the succeeding flowage of SiH₄ during introduction of CVD gas. In the blanket deposition, deposition was carried out through process steps shown in FIG. 12B. The deposition procedure was carried out for the thermally grown SiO₂ coated wafers with exactly the same deposition conditions.

Firstly, the wafer with thermal oxidized film of SiO₂ was used. In an attempt to clarify a reaction gas component due to a reaction in an analysis tube of the QMS analyzer 18 or an electrical noise component by using a thermal-SiO₂ covered wafer, the amount of SiF3+ions was measured with the QMS analyzer 18 under the condition that the wafer was not heated and the deposition reaction did not proceed at all while the CVD material gas was admitted into the analysis tube. Subsequently, the lamp was turned on to heat the wafer to 230° C. and the reaction amount in the reactor 9 was measured by measuring the amount of SiF3+. Thereafter, for comparative measurement, the Si wafer and a wafer for selectivity evaluation were used to measure the SiF3+ amounts for the blanket CVD and selective CVD.

Figure 16:
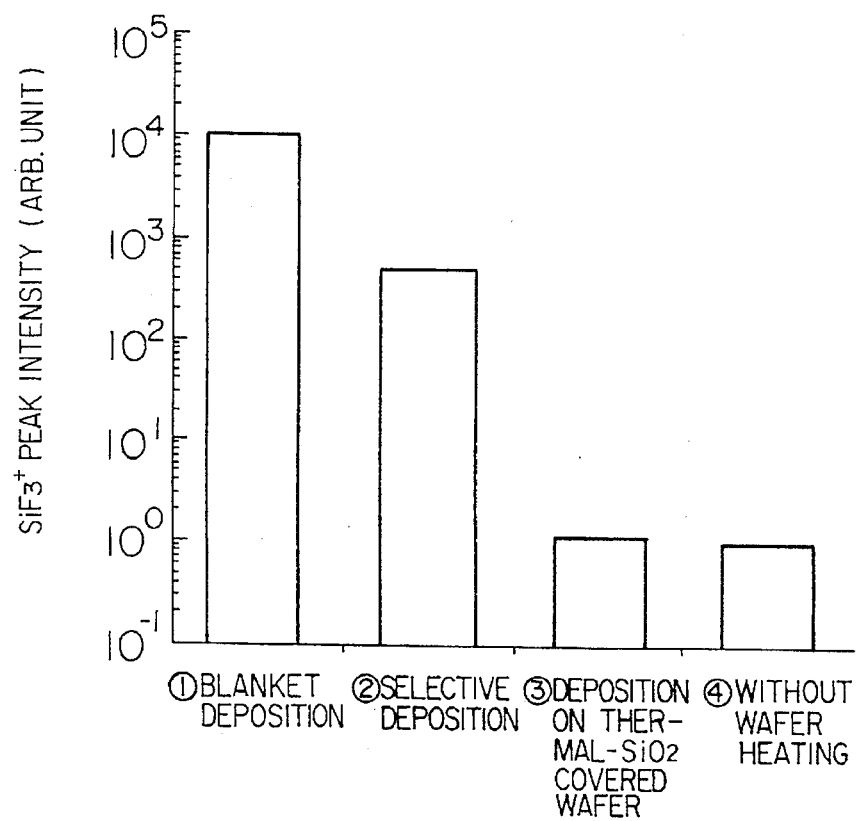
FIG. 16 is a graph for comparatively explaining amounts of reaction in the CVD reactor of the present invention.

Results of the evaluation of the CVD reaction amounts in the reactor 9 obtained in this manner are shown in FIG. 16.

Incidentally, the CVD reaction can be expressed by any one of the following chemical formulas:

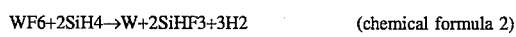

WF6+2SiH4→W+2SiHF3+3H2    (chemical formula 2)

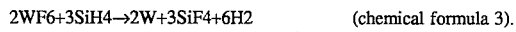

2WF6+3SiH4→2W+3SiF4+6H2    (chemical formula 3).

Accordingly, by monitoring SiF3+resulting from ionization of a reaction product of SiF4 or SiHF3, the presence or absence of a reaction can be determined. As will be seen from FIG. 16, the relative peak intensity of SiF3+is 10⁴ for the blanket CVD and 5×10² for the selective CVD, whereas for the SiO₂ covered wafer, the peak intensity is 1.1, which is approximately equal to 1 obtained in the case where the wafer is not heated, and considered to be a noise level.

Gathering from this, it can be demonstrated that the amount of a reaction at a site inside the reactor, except the wafer, such as the inner wall of the reactor or the wafer susceptor, is suppressed to 1/10⁴ or less of the amount of a reaction at the wafer in the case of the blanket CVD and to 1/10² or less of the amount of a reaction at the wafer in the case of the selective CVD.

Figure 17:
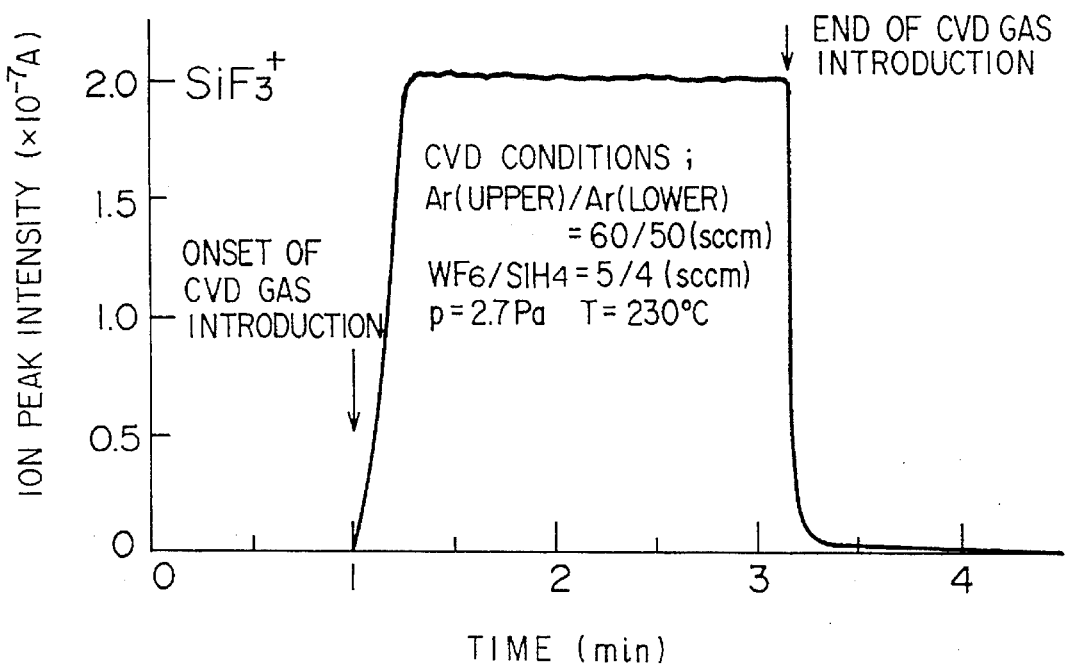
FIG. 17 is a graph for explaining a change with time in SiF3+ peak intensity during CVD in the embodiments of the present invention when selective CVD is carried out.
Figure 18:
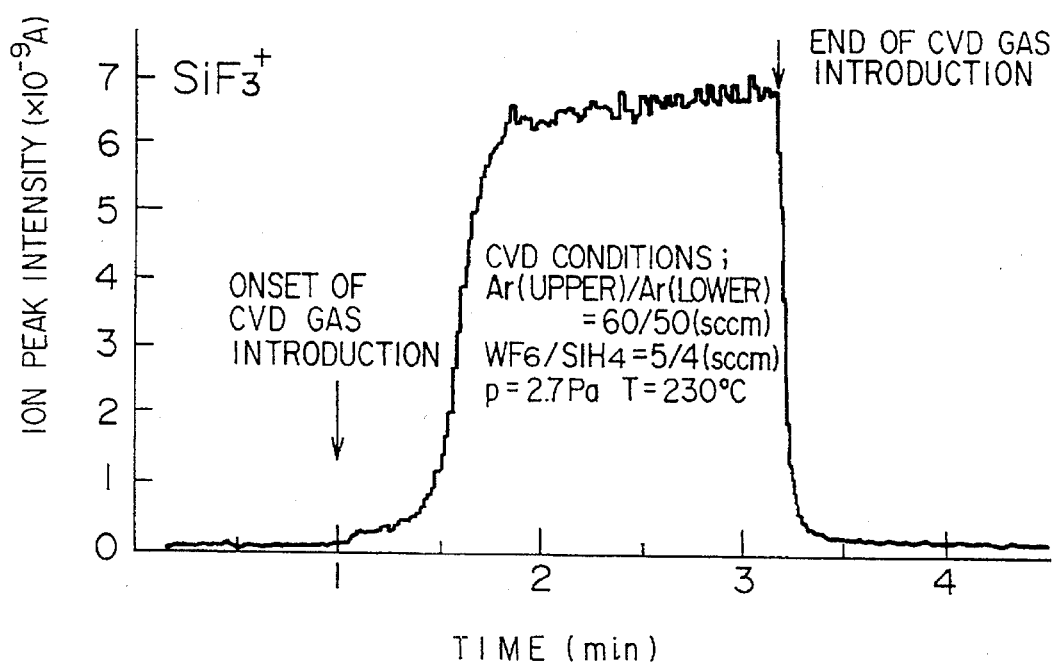
FIG. 18 is a graph for explaining a change with time in SiF3+ peak intensity during CVD in the embodiments of the present invention when blanket CVD is carried out.

FIGS. 17 and 18 show changes with time in the SiF3+ peak intensity during the deposition in the above evaluation experiments. FIG. 17 is a graph useful to explain the change with time in the SiF3+peak intensity during the blanket deposition and FIG. 18 is a graph useful to explain the change with time in the SiF3+ peak intensity during the selective deposition. It will be appreciated that during the selective deposition, a lag time occurs prior to the start of deposition even when a heat treatment is carried out following a pre-treatment.

(2) Evaluation of Ar Gas Supply Amount to Wafer Backside and Film Deposition to Wafer Backside.

Figure 19:
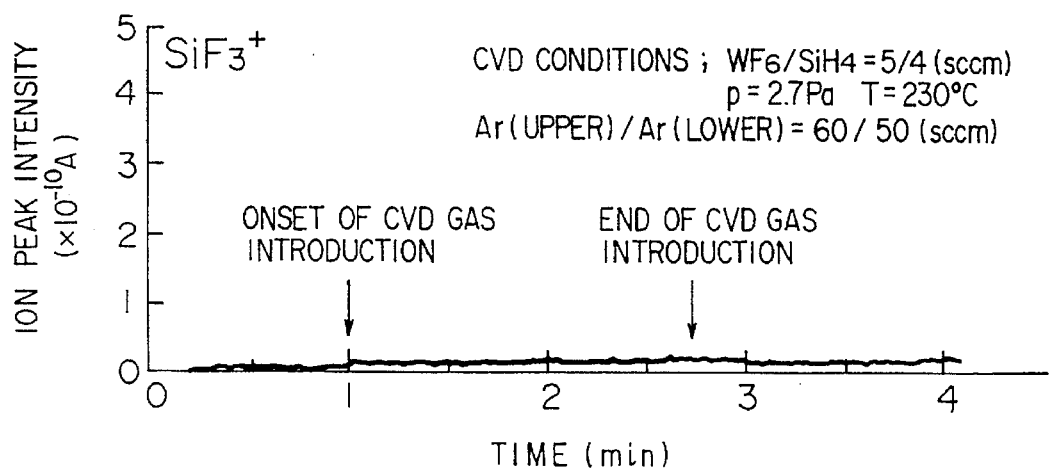
FIG. 19 is a graph for explaining a change with time in SiF3+ peak intensity during CVD when the flow rates of Ar gas for purge passed to the top (upper) side and backside (lower) side of a thermal oxidized-film covered wafer are changed under the condition of Ar(upper)/Ar(lower)=60/50(sccm).

FIG. 19 is a graph for explaining the state of film deposition on the backside of the wafer 2 when the supply amount of Ar gas passed to the backside of the wafer 2 is changed. Here, the Ar gas supply amount to the wafer backside is changed under such a flow rate condition that the total of a diluted Ar gas flow rate (abbreviated as Ar(upper)) passed through the wafer shower head 1 and an Ar gas supply amount (abbreviated as Ar(lower)) passed to the backside of the wafer 2 is rendered to be constant in order to keep the CVD conditions unchanged.

The results are shown in FIG. 19, according to which a change in peak intensity corresponding to a reaction amount in the QMS analysis tube is observed immediately after the introduction of the CVD gas, but an increase in peak intensity corresponding to the deposition on the backside of the wafer which proceeds as the time elapses is hardly detected. Namely, under a flow rate condition of Ar(upper)/Ar(lower)=60/50 (sccm), film deposition on the backside of the wafer 2 is not observed.

Figure 20:
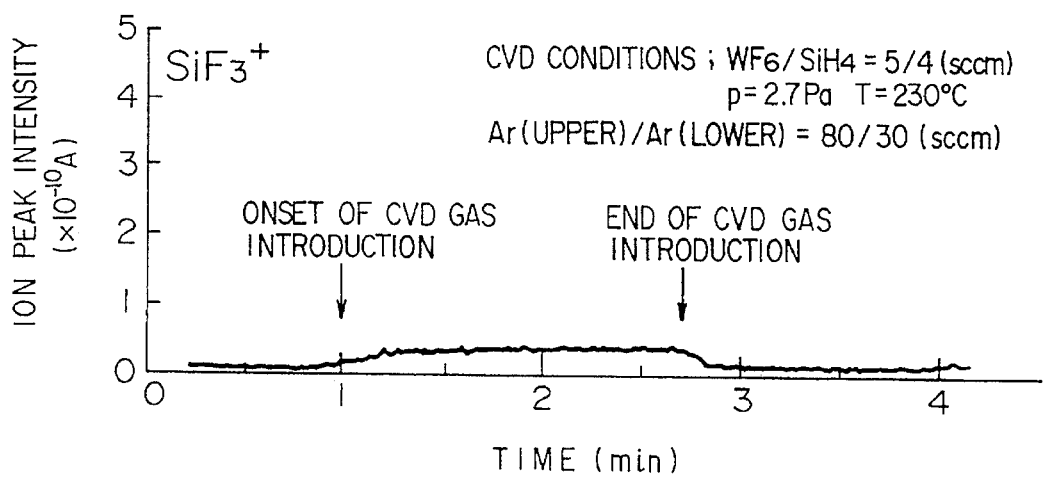
FIG. 20 is a graph for explaining a change with time in SiF3+ peak intensity during CVD when the flow rates of Ar gas for purge passed to the top side and backside side of the thermal oxidized-film covered wafer are changed under the condition of Ar(upper)=Ar (lower)=80/30(sccm).
Figure 21:
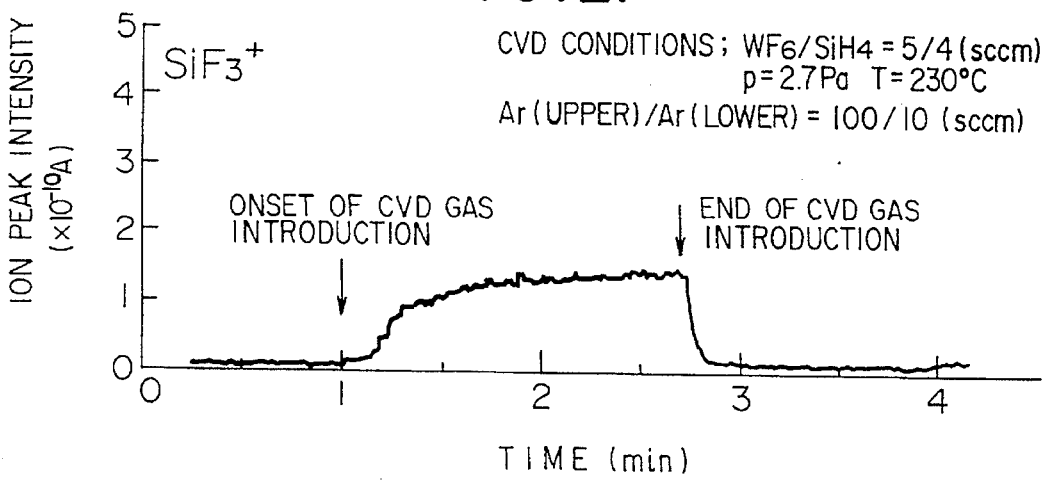
FIG. 21 is a graph for explaining a change with time in SiF3+ peak intensity during CVD when the flow rates of Ar gas for purge passed to the top side and backside side of the thermal oxidized-film covered wafer are changed under the condition of Ar(upper)=Ar (lower)=100/10(sccm).

FIGS. 20 and 21 are graphs for explaining changes in peak intensity when the Ar gas purge amount for the wafer backside is decreased in such a way that the Ar gas purge amount changes to Ar(upper)/Ar(lower)=80/30(sccm) and then to Ar(upper)/Ar(lower)=100/10 (sccm). As shown in FIGS. 20 and 21, the deposition reaction amount on the backside increases gradually as the Ar gas purge amount for the wafer backside decreases. The SiO₂ covered wafer used in the evaluation is prepared through thermal oxidation and its backside is also covered with SiO₂ completely. As long as the wafer taken out of the apparatus after CVD is observed with the eye, no traces of deposition are left and accordingly it is predicted that deposition is effected on the wafer susceptor pins 6 which are the sole members heated to a high temperature in the space Eo on the side of the wafer backside.

The above evaluation has demonstrated that when purging is carried out by admitting the inert gas at a certain flow rate, film deposition on the wafer backside can be suppressed perfectly in the CVD reactor apparatus according to the present invention. But calculation based on an Ar flow path sectional area and an Ar flow rate indicates that when the gas flow rate is 50 (sccm), the Ar gas blows off vigorously from a gap between the wafer clamp 5 and the Si wafer to the wafer top at about 330 m/sec, thus affecting film thickness deviation from the average value as will be studied below.

(3) Evaluation of Film Thickness Deviation from Average Value of W-film Deposited on Wafer Front In the above evaluation, the fact that the film deposition on the wafer backside can be suppressed perfectly by increasing the Ar (lower) flow rate to some extent has been shown, but contrarily, a decrease in the film thickness deviation due to an increase in the Ar (lower) flow rate is predicted. Then, to examine the influence of the Ar(lower) flow rate, the blanket CVD was carried out. In this case, a Si substrate was used as wafer 2, sputter-etching at only Ar 100 sccm shown in FIG. 12B was practiced in the plasma pre-treatment because the deposition is blanket deposition and the deposition time was 20 min.

The film thickness uniformity was measured by a stylus type step meter. A step of W was formed by masking a deposited W-film with Electro-Wax, etching the W-film with H$_2$O$_2$ and, then, removing the wax by trichloromethane (chloroform). The steps were formed with separation of 1 mm in the edge of the wafer, and 15 mm in the rest of the wafer.

Figure 22:
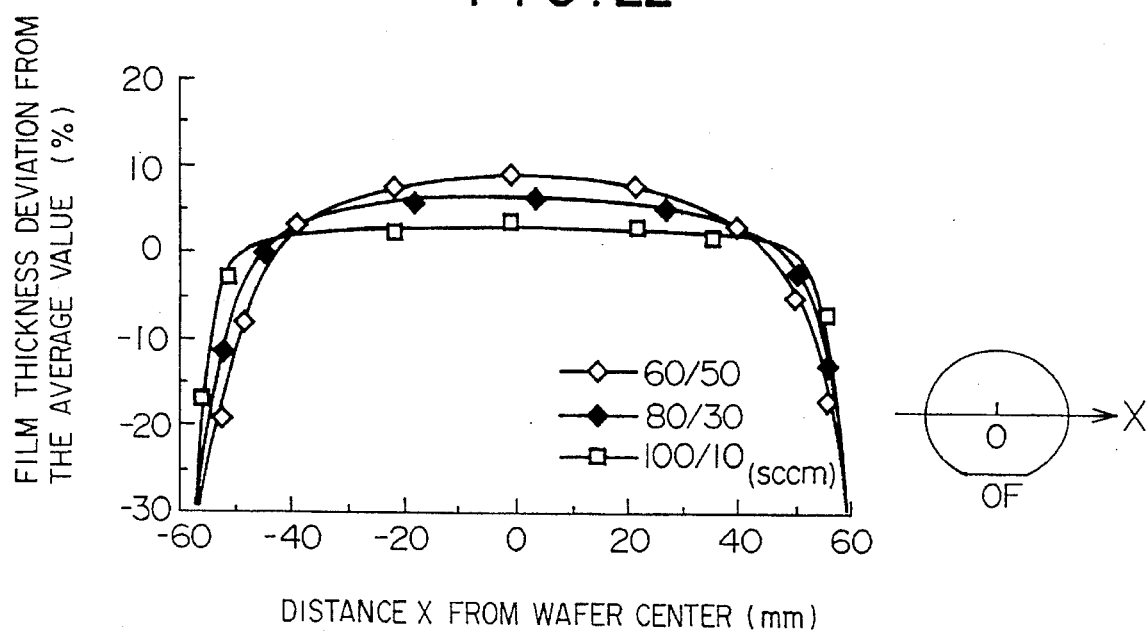
FIG. 22 is a graph showing the dependency of W-film thickness deviation from the average value upon the backside purge gas flow rate in the embodiments of the present invention.

FIG. 22 is a graph for explaining the dependency of the film thickness deviation of a blanket deposition wafer upon the purge Ar gas flow rate. The abscissa represents the distance from the center of the wafer 2 in a direction which is in parallel with the wafer's oriented-flat and the ordinate represents the film thickness deviation from the average value. As is clear from FIG. 22, the film thickness deviation tends to be degraded as the flow rate of backside Ar gas increases and amounts to ±2% for a backside Ar gas flow rate of 10 sccm and ±8% for a backside Ar gas flow rate of 50 sccm (±8% being a standard deviation of the film thickness deviation within an area of a diameter of 120 mm or less in a wafer 2 of 5 inches), indicating that the film thickness deviation is degraded as anticipated. But in the present invention, the Ar blow-off gap d between the top of the wafer 2 and the wafer clamp 5 is 0.25 mm and predictively, the film thickness deviation can be lessened by decreasing the gap d to reduce the Ar purge flow rate. In addition, the influence of a temperature distribution of wafer 2 due to a light irradiation intensity distribution of the heating lamp is involved and presumably the film thickness deviation can further be lessened by improving these factors. The present embodiment has been described by way of the selective CVD of W, but when the process conditions (for example, gas flow rate condition and reactor internal pressure) change, the gap changes in its optimum value and therefore the value of d which is 0.25 mm in the present embodiment has no critical meaning.

Figure 23:
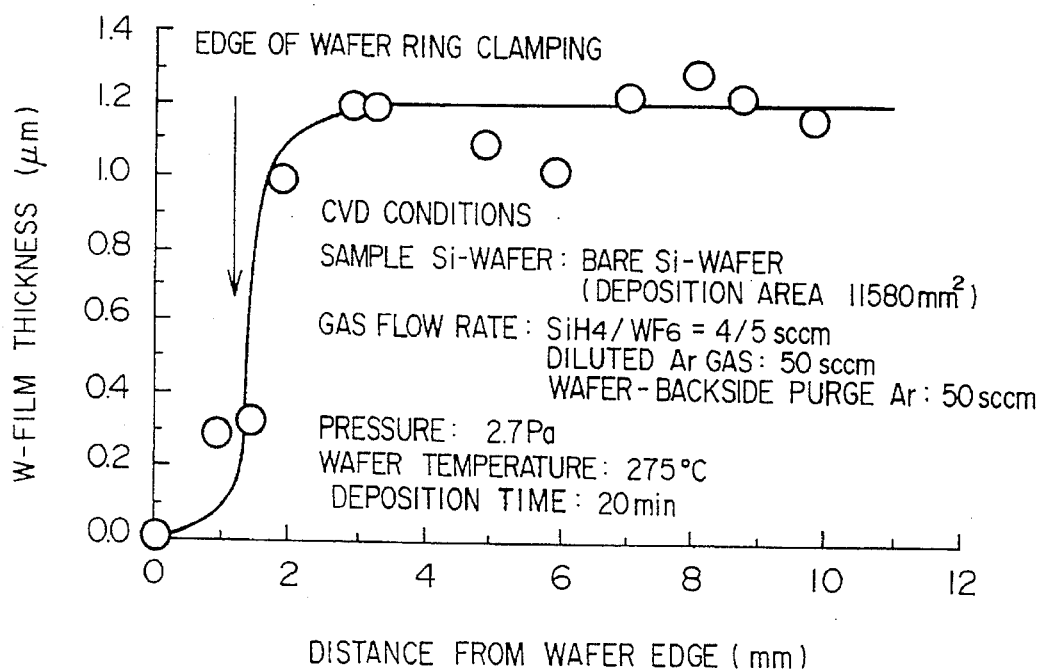
FIG. 23 is a graph showing the W-film thickness deviation from the average value at the wafer edge in the embodiments of the present invention.

FIG. 23 is a graph for explaining a film thickness deviation at the wafer edge portion. The edge of the wafer clamp 5 is considered to be at a position about 1.3 mm distant from the edge of the wafer 2. The film thickness deviation rises substantially perfectly at a site about 2 mm distant from the wafer edge and as long as this data is relied on, a problem that the purge Ar dilutes the CVD gas concentration at the wafer edge portion to decrease the film thickness at the edge portion will not arise. It has been proven that the influence of the purge Ar upon the W-film thickness at the edge portion is of insignificance.

(4) Evaluation of Dependency of Selectivity Violation on the Number of Treated Wafers in Sequential Deposition, The fact that unwanted film deposition on portions other than the front of the wafer 2 does not occur in the CVD reactor apparatus according to the present invention has already been described. This implies that the present CVD reactor can perform sequential processings without effecting chamber cleaning. Then, degradation in the reactor performance taking place when sequential deposition was carried out without chamber cleaning was evaluated acceleratedly. Details of deposition conditions and flow of the wafer 2 are indicated in a table of FIG. 25. Here, the degradation in the reactor performance is defined by an increase in the number of W particles generated by selectivity violation on the thermal oxidized film (hereinafter abbreviated as SiO$_2$) in sequential processings of the wafer 2. The film deposition was repeated 11 times with regular deposition conditions onto thermally grown SiO$_2$ coated wafers while 100 deposition runs were executed between the above-mentioned deposition runs onto Si bare wafers with an elongated increased deposition time (10 times longer than the one for the thermally grown SiO$_2$ wafers), ending up with the total number of 1000 runs with the elongated deposition time, and 11 deposition runs with the elongated time. In evaluating measurements of the number of particles, a SiO$_2$ covered wafer 2 having particles the number of which had been measured was used. Deposition onto SiO$_2$ was conditioned such that the deposition amount was 0.4 µm in selective deposition. In blanket deposition, a bare Si-wafer was used and with a view of enhancing adhesiveness of W-film, Si-reduced reaction was conducted for one minute, followed by blanket deposition by SiH$_4$ reduction for 20 minutes.

Figure 24:
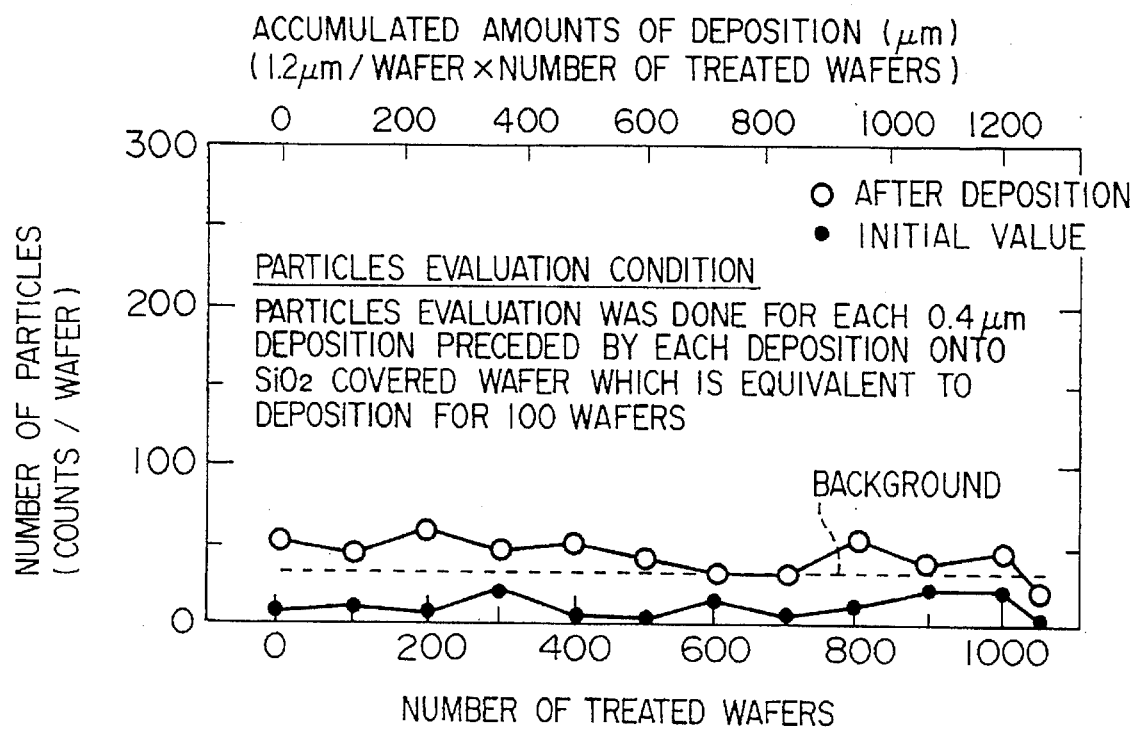
FIG. 24 shows the selectivity degradation tendency as a function of number of processed wafers in the case where no chamber cleaning etching was performed.

FIG. 24 is a graph for explaining dependency of selectivity violation on the number of treated wafers. The abscissa represents the total number of treated wafers and accumulated amounts of deposition obtained when deposition is carried out without chamber cleaning and the ordinate represents the number of particles having a size of 0.3 µm or more and being present on the oxidized film surface subjected to deposition processing every 100 wafers of blanket deposition. In FIG. 24, the initial value indicates the number of particles on the oxidized film before the deposition processing which amounts to 2 to 18, though varying for one wafer 2 and another. On the other hand, the number of particles after the deposition processing is 20 to 60 to provide a substantially constant level. This value is substantially equal to a background level. The background level referred to herein is an average value of the numbers of particles which are not generated through deposition but are generated by wafer handling or exposing the wafer 2 to gas. One wafer handling operation was effected for transferring a wafer from one wafer case to another by using a vacuum tweezer and the gas exposing treatment was effected to expose the wafer to actual deposition gas three times and to Ar gas once. As a result, the background level was 34 particles/wafer.

On the other hand, the average value of the number of particles obtained during actual deposition was 48 particles/wafer. Accordingly, a subtraction difference from the above background level, that is, the number of particles considered to be deposited due to pure deposition is 14 particles/wafer which is about 1/5 of the number of LSI chips on a 5-inch wafer and is considered to be within an allowable range. Further, this value does not depend on the number of wafers to be processed and is substantially constant, demonstrating that the number of particles does not increase even when cleaning of the CVD reactor is omitted.

The fact that the above sequential deposition processings effected acceleratedly is allowed to proceed up to 1000 wafers without cleaning can be evaluated in terms of the number of treated wafers obtained through ordinary selective deposition process as follows. In particular, selective deposition onto an area which is 1/100 of a wafer area is assumptively considered. In the blanket deposition onto one wafer in the accelerated test, a deposited film of 1.2 µm is formed in 20 minutes and this corresponds to the deposition amount for 300 wafers and the deposition time for 10 wafers in terms of selective deposition for depositing a film thickness of 0.4 µm in 2 minutes. Accordingly, the sequential deposition processings for 1000 wafers can be estimated to be a sequential processings of selective deposition of the deposition amount for 300000 wafers and the deposition time for 10000 wafers carried out without chamber cleaning. The above estimate is effected on the assumption that the selective deposition is carried out onto an area which is 1/100 of the wafer area, but in practical selective deposition generally effected for the sake of embedding tungsten in fine through-holes, the opening area of fine through-holes can be presumed to be 1/1000 or less of the wafer area and presumably, the sequential deposition is allowed to proceed for the number of wafers which exceeds the above estimated value. From the foregoing, it has been confirmed that the CVD reactor apparatus according to the present invention does not require cleaning for each wafer and can sufficiently cope with a degradation in throughput which is otherwise caused by the cleaning operation. Because of the time limit, the evaluation was limited to the sequential processings for 1000 wafers at the most, but gathering from the condition of the chamber interior observed by eye after completion of experiments, it is considered that further sequential processings could to be allowed.

While the foregoing embodiment of the present invention has been described by way of the selective deposition of W, it is apparent that the present invention is not limited thereto and may, of course, be applied to the selective CVD processes of metals such as Al, Mo or Cu as well as to blanket CVD processes in which deposition on the side surface and/or backside of a wafer is not desired, to thermal CVD processes of metal films, insulating films or semiconductor films, and to plasma CVD processes provided that the rate determining factor for the reaction is the wafer surface reaction.

[Embodiment 2]

An embodiment will now be described which takes advantage of the CVD reactor apparatus of the present invention featuring that reaction is allowed to take place at only the front of the wafer 2 and in which a deposition reaction monitor is connected to examine effects which cannot be attained conventionally. More specifically, the CVD reactor apparatus of the present invention can provide information necessary for practical device manufacture and therefore it can be monitored in a real time manner to obtain monitor data which can be utilized for process condition control or used to insure quality of product wafers to thereby contribute to reduction of irregularity in process and promotion of automation leading to improved productivity, as will be described below. Further, when a temperature monitor is applied to the reactor apparatus of the present invention, parts are not damaged or deteriorated by plasma and do not change with time to permit process condition control and guarantee quality of product wafers, as will be described below.

Figure 26:
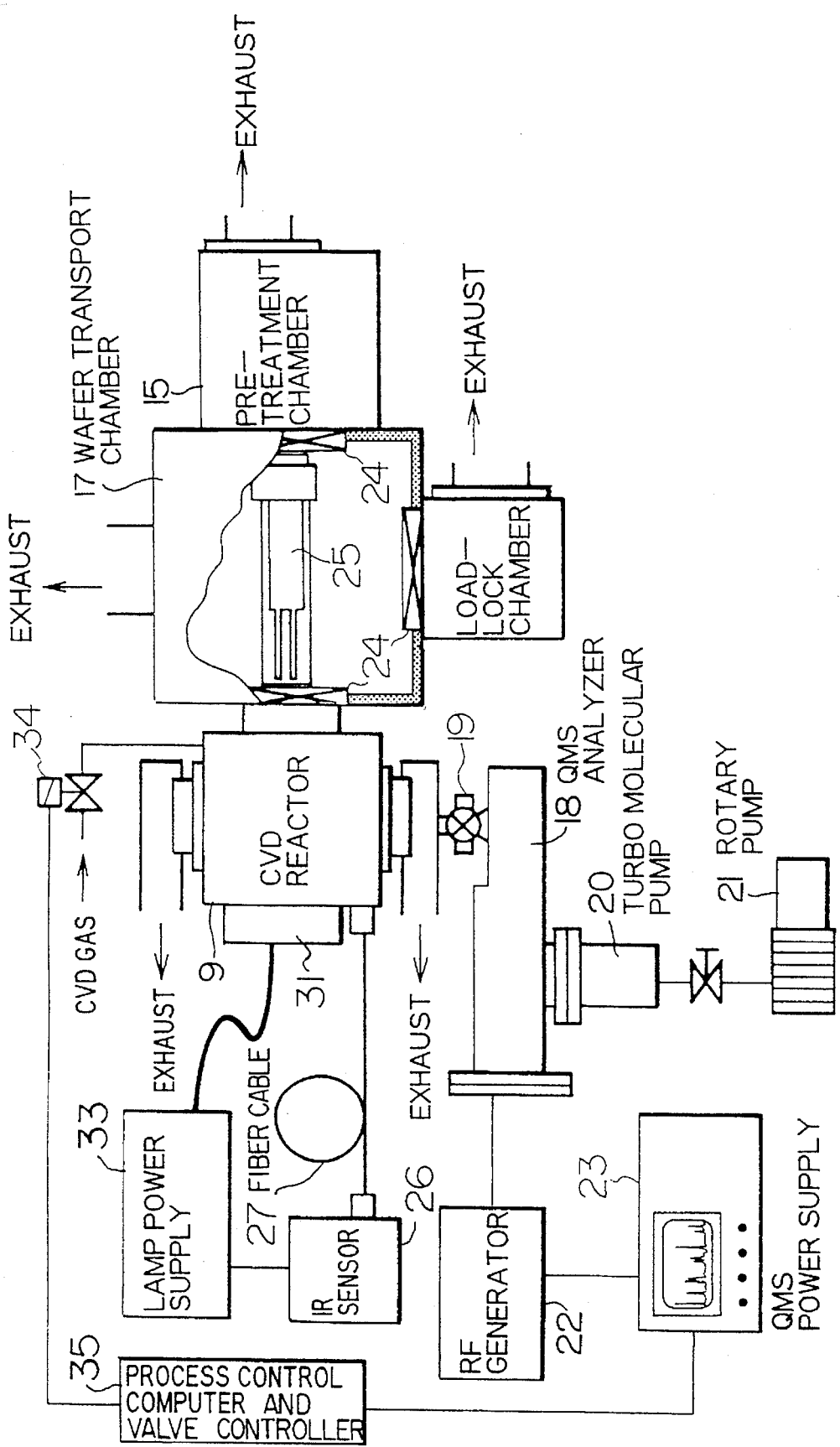
FIG. 26 shows the first embodiment of the present invention where a reaction gas monitor of the CVD reactor is connected to a CVD reactor.

FIG. 26 is a diagram showing the second and the third embodiments of CVD reactor system according to the present invention in which a reaction gas monitor of the CVD reactor apparatus is connected to the CVD system.

The construction shown in FIG. 26 is substantially the same as that shown in FIG. 11 for explaining that deposition does not take place on unwanted portions other than the wafer front in the CVD reactor of the present invention but the present construction adds to the FIG. 11 construction the transmission of monitor data from the QMS analyzer 18 standing for a reaction gas monitor to a process control computer and valve controller 35 and the drive control of a CVD gas (WF6) valve 34 effected by using a valve switching control unit in accordance with a reaction state. Further, in FIG. 26, for stable control of the wafer temperature to a predetermined value, a lamp power supply 32 controls the intensity of a heating lamp 31 by using wafer temperature monitor data delivered from an IR sensor (pyro-thermometer) through a fiber cable 27.

Figure 27:
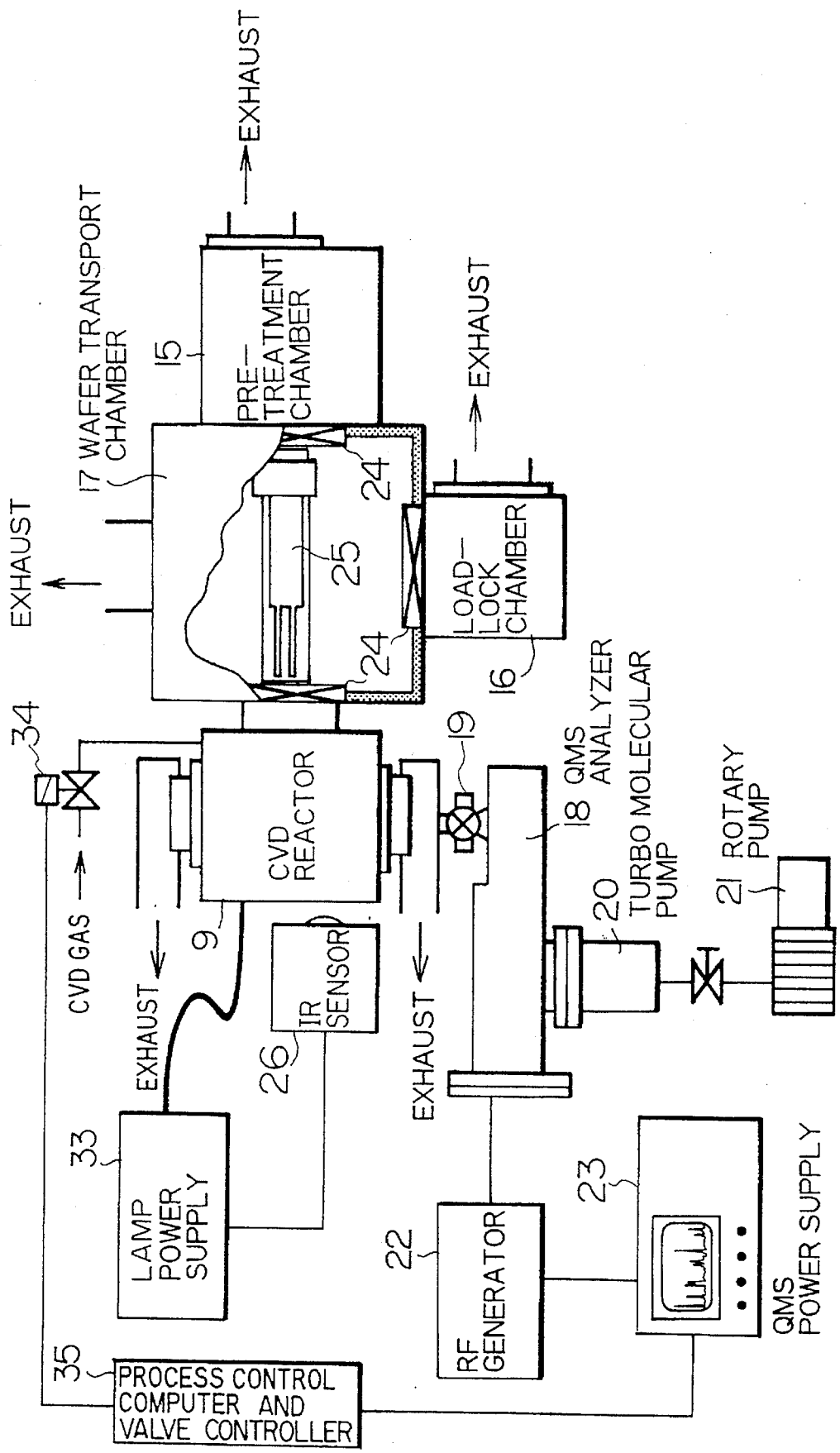
FIG. 27 is a schematic diagram showing a second embodiment of the CVD system according to the present invention in which the CVD reactor apparatus is connected to a monitor.

FIG. 27 shows the fourth embodiment of CVD reactor system according to the present invention in which a reaction gas monitor of the CVD reactor is connected to the CVD system. Structurally, this embodiment is identical to the FIG. 26 embodiments with the only exception that the fiber cable 27 is not used for wafer temperature monitoring and the wafer is heated by using the heater stage 14 shown in FIG. 8.

Firstly, how irregularity in film thickness of individual wafers after deposition can be suppressed will be described by referring to an example of the process for blanket deposition of a W-film on a wafer.

Differing from the SiH$_4$ gas-reduced reaction described previously, a CVD reaction by a H$_2$ gas-reduced reaction to be described herein is expressed by the following chemical formula:

$$WF6+H_2 \rightarrow W+6HF \qquad \text{(chemical formula 4)}.$$ 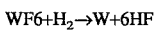

Figure 28A:
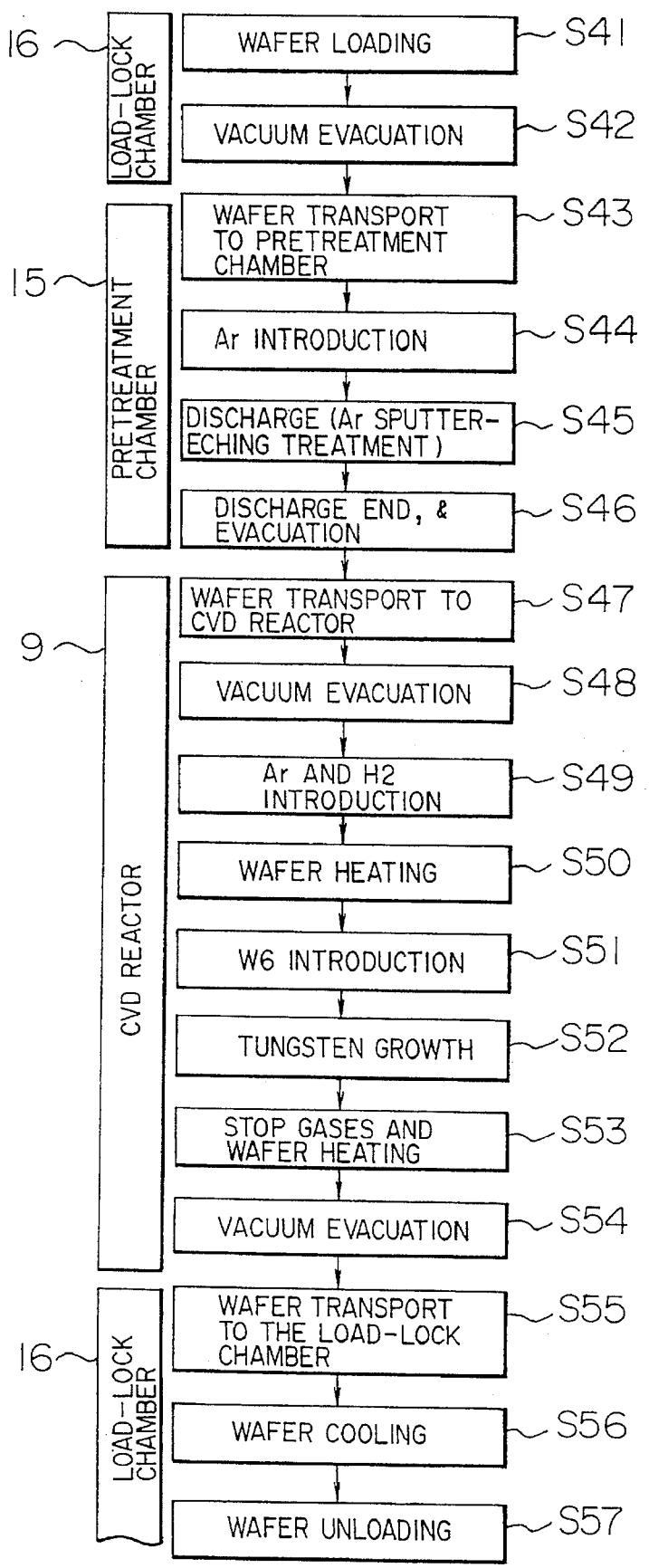
FIG. 28A is a CVD process chart illustrating when the reaction gas monitor is not used in the conventional technique.
Figure 28B:
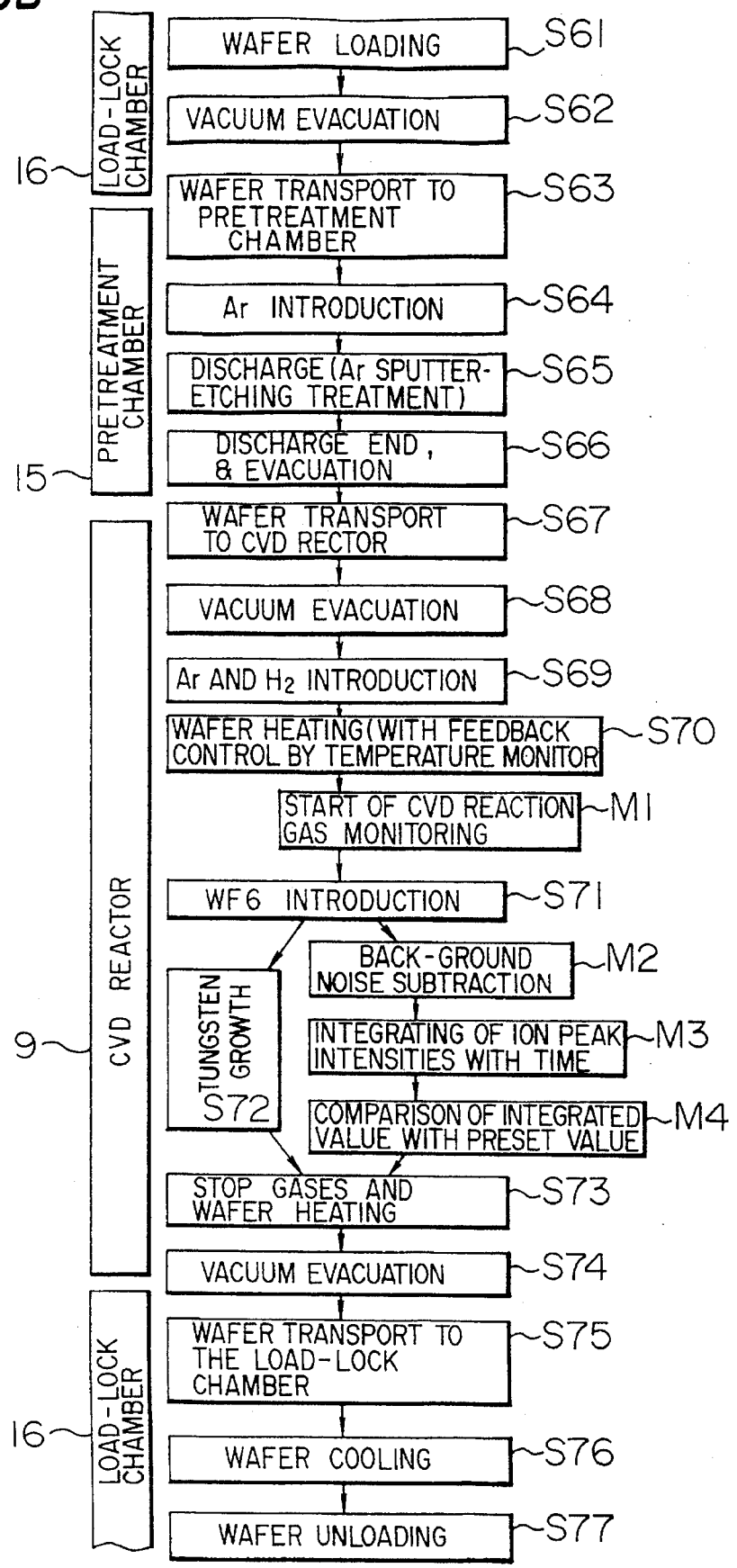
FIG. 28B is a CVD process flow chart illustrating when the reaction gas monitor is used in the present invention.

Then, by monitoring HF which is a reaction created gas, growth conditions of the W film can be grasped. FIG. 28A is a CVD process chart when the reaction gas monitor is not used as in the case of the conventional technique and FIG. 28B is a CVD process chart when the reaction gas monitor is used in the present invention. FIG. 28A which is useful to explain the procedure according to the conventional method, is substantially the same as the procedure shown in FIG. 12B, except that the reduction gas is changed from SiH$_4$ to H$_2$. But the FIG. 28B procedure of the present invention is different from the conventional procedure in that HF gas is monitored in the form of HF+ by the reaction gas monitor during W-film deposition, the HF+ ion intensity is integrated with time by the process control computer and valve controller 35 and when the integrated value reaches an initially preset value, the CVD gas valve 34 is closed by means of the process control computer and valve controller 35 to stop the introduction of WF6, thereby ensuring that the deposition amount can always be controlled to a desired value. Results of the monitoring of reaction gas during deposition are shown in FIG. 29.

Figure 29:
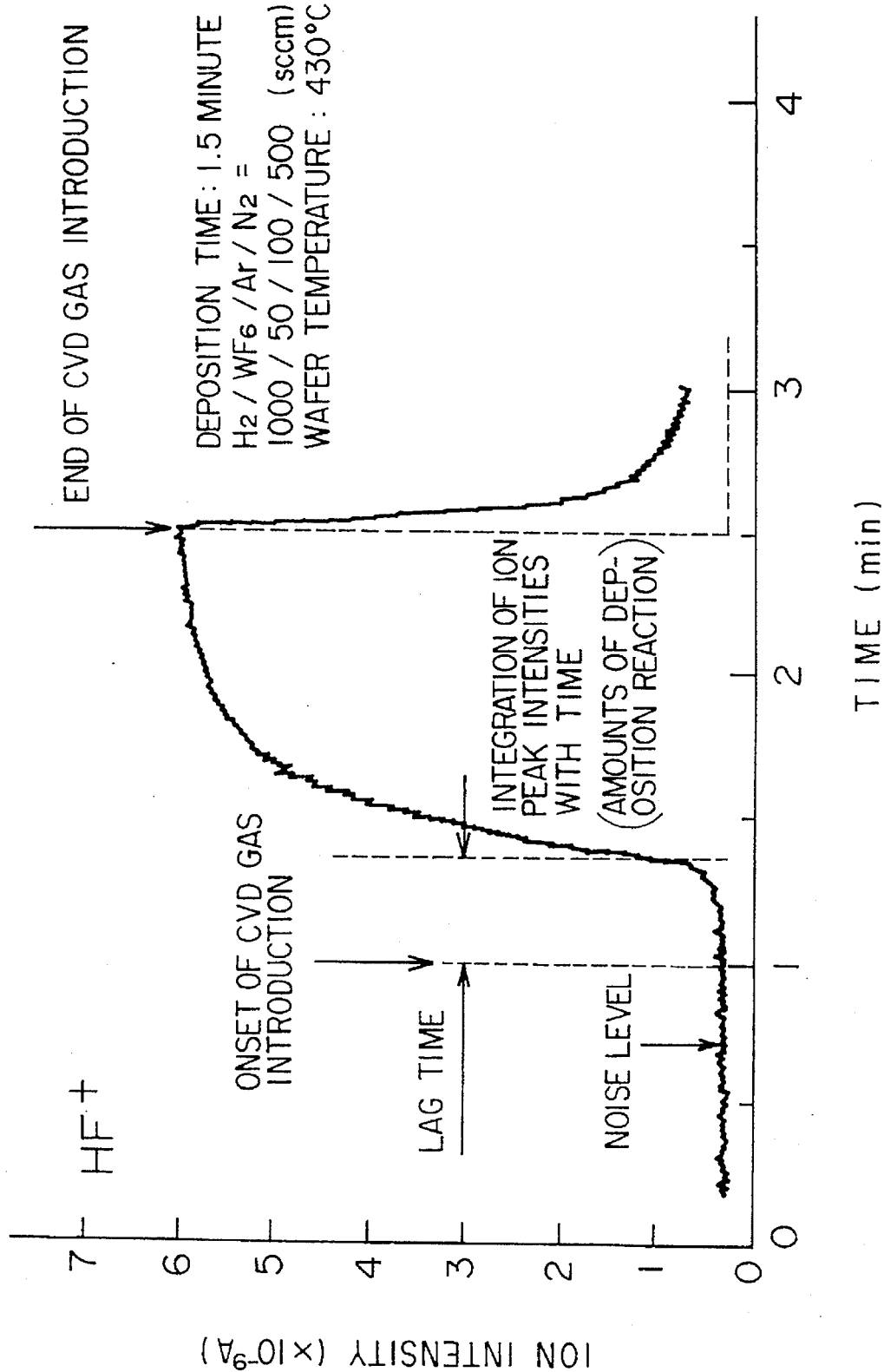
FIG. 29 is a graph showing a change with time of HF+peak intensity during CVD in the embodiments of the present invention.

FIG. 29 is a graph showing a change in HF+ peak intensity during CVD in the embodiment of the present invention and it will be seen from FIG. 29 that the deposition reaction is not started immediately when WF6 gas is introduced but is started following a time lag. This time lag is called a deposition lag time. The Figure also indicates that by stopping the introduction of WF6 when the integration of ion peak intensities with time equals a preset value, the reaction ends rapidly.

The process control computer and valve controller 35 receiving data from the QMS analyzer 18 starts measurement for calculation of a noise level of HF+peak intensity before WF6 gas is actually introduced and carries out integration operation by subtracting the noise from the HF+ peak obtained after the WF6 gas is introduced. The integration of ion peak intensities with time corresponding to the amounts of deposition reaction is shown in the netted portion in FIG. 29.

In order to demonstrate the effect of suppressing irregularities in film thickness, the film thickness irregularity obtained when the deposition is done by merely making the CVD gas introduction time equal to the deposition time, as in the case of the conventional technique, is compared with the film thickness irregularity obtained when the deposition is done by carrying out the control operation using the reaction gas monitor according to the present invention.

Figure 30:
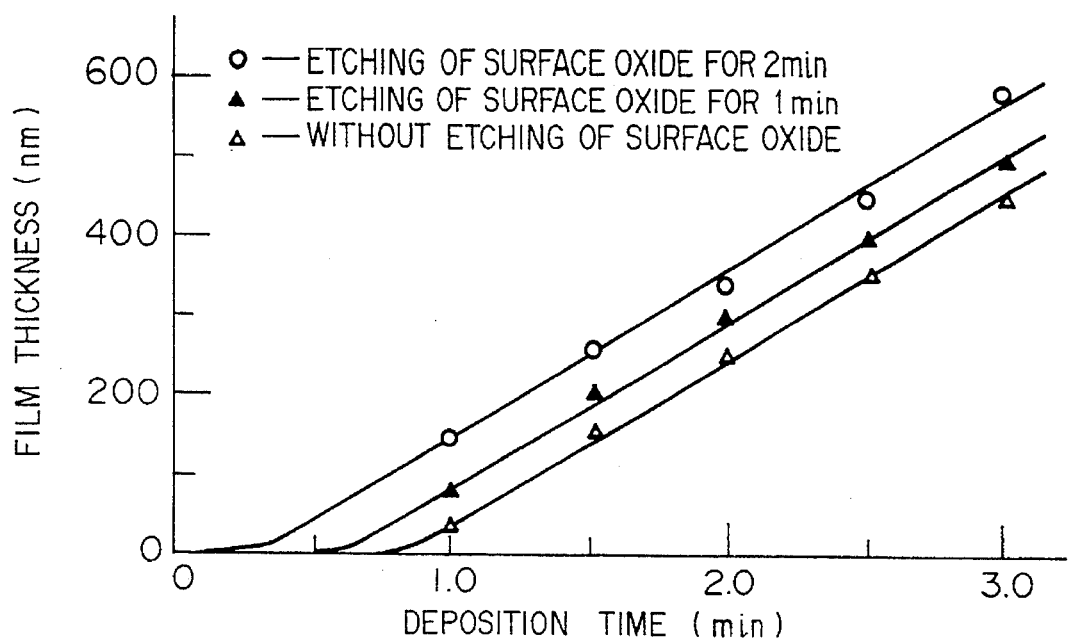
FIG. 30 is a graph showing the relation between the deposition time and the film thickness obtained with the conventional technique not using the reaction gas monitor when the amount of deposition on a wafer is changed while changing the pre-treatment time.
Figure 31:
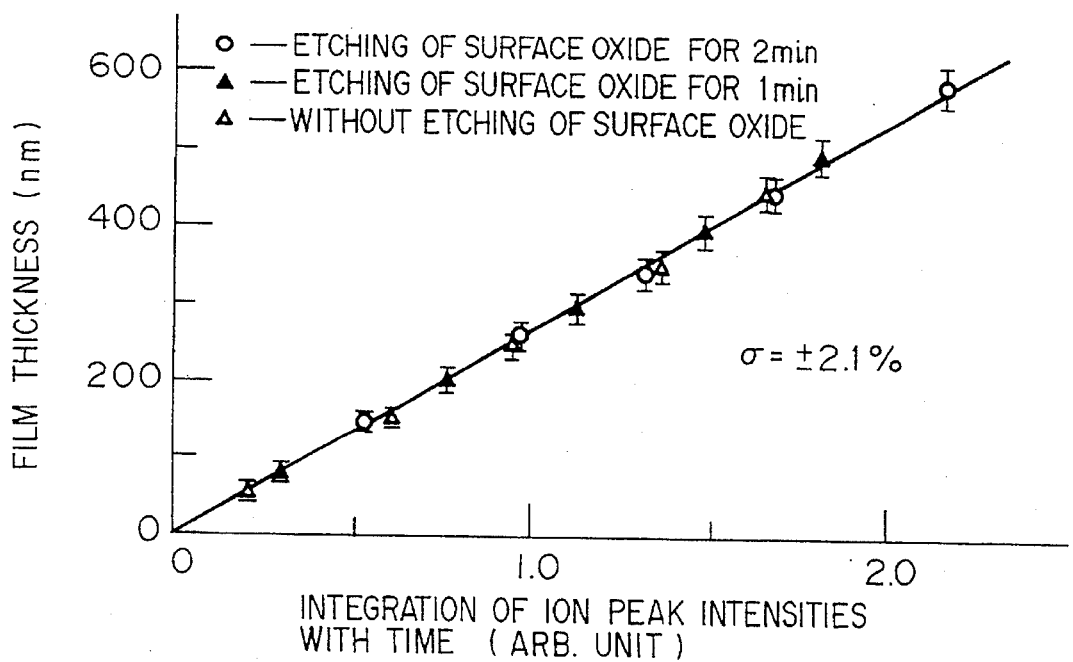
FIG. 31 is a graph showing the relation between the integration of ion peak intensities with time and the film thickness obtained with the present invention using the reaction gas monitor when the amount of deposition on the wafer is changed while changing the pre-treatment time.

FIG. 30 is a graph showing the relation between the deposition time and the film thickness when the deposition time is changed during deposition on a wafer which is prepared by intentionally changing the time for etching pre-treatment of surface oxidized film to change the deposition lag time, and FIG. 31 is a graph showing the same relation in terms of the relation between the integration of ion peak intensities with time and the film thickness. When the film thickness is controlled on the basis of only the deposition time (a time interval between the onset of CVD gas introduction and the end thereof) as in the case of the conventional technique, the film thickness varies greatly as shown in FIG. 30 because of a difference in wafer surface state before deposition (here, a difference in time for etching pre-treatment), whereas when film thickness control based on the integration of ion peak intensities with time according to the present invention is carried out, it has been proven that the film thickness irregularity can be suppressed with an accuracy of about 2%.

When a temperature monitoring device is employed in the reaction chamber, since the reactor chamber of the present invention does not require the chamber cleaning step, the temperature measuring device has no chance to be damaged in the chamber cleaning step in which it is exposed to physical plasma damage and/or to the corrosive environment.

Cross-sectional sketches of the CVD reactors according to the present invention are shown in FIGS. 32 to 35, corresponding to the first to the fourth embodiments, respectively. These embodiments are derived from the ones shown in FIGS. 1 to 8 with an employment of the wafer temperature monitor in the CVD reactor.

In the wafer temperature monitor of the present invention, a method of collecting infrared radiation light from the wafer backside by means of a quartz rod 28 to guide the light to the outside of the reactor or a method of directly collecting light transmitting through an IR transparent window 30 by means of a lens was used.

Figure 32:
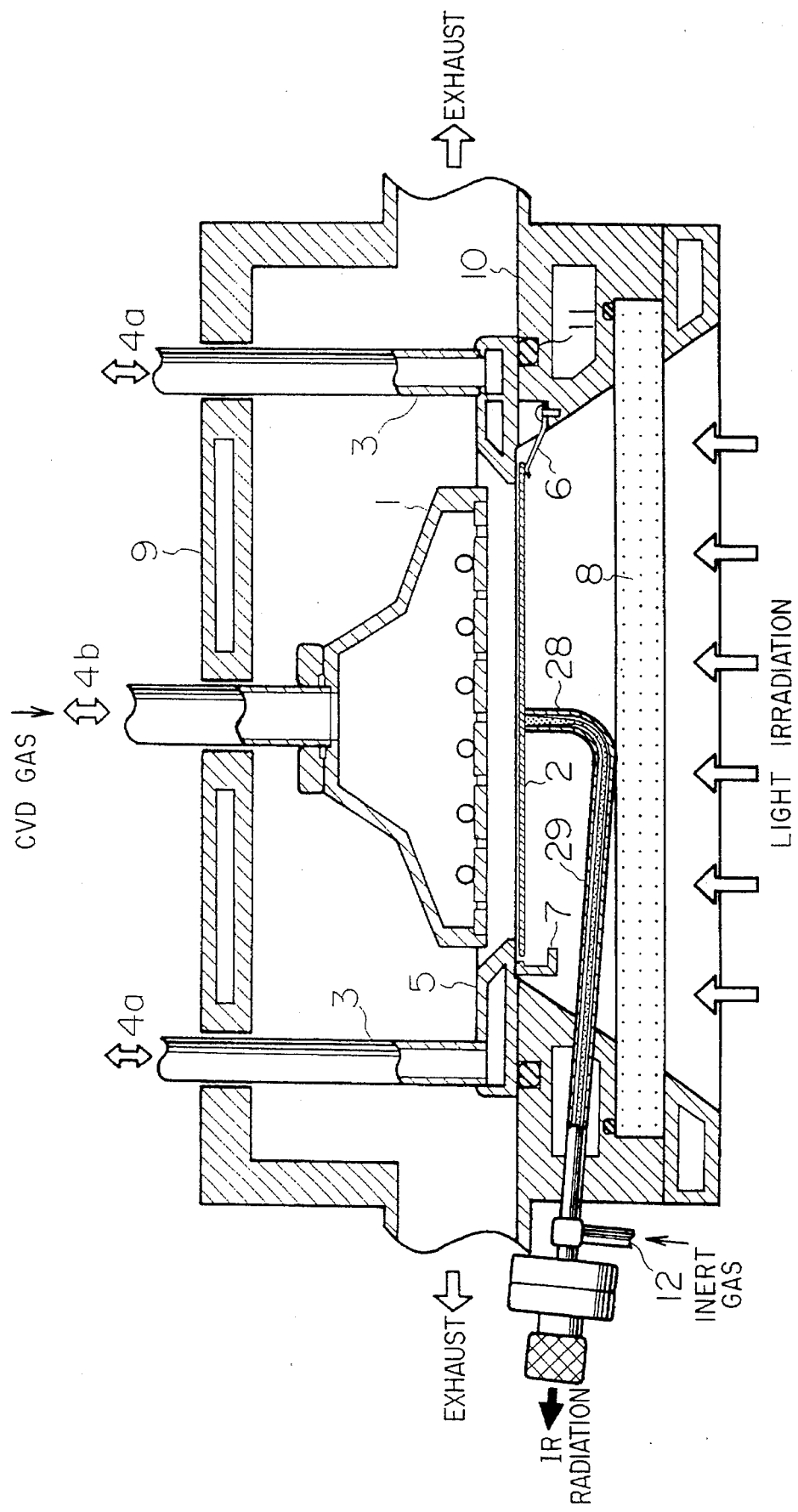
FIG. 32 is a sectional view showing a first embodiment of a CVD reactor apparatus according to the invention in which a CVD reactor is connected to a monitor.
Figure 33:
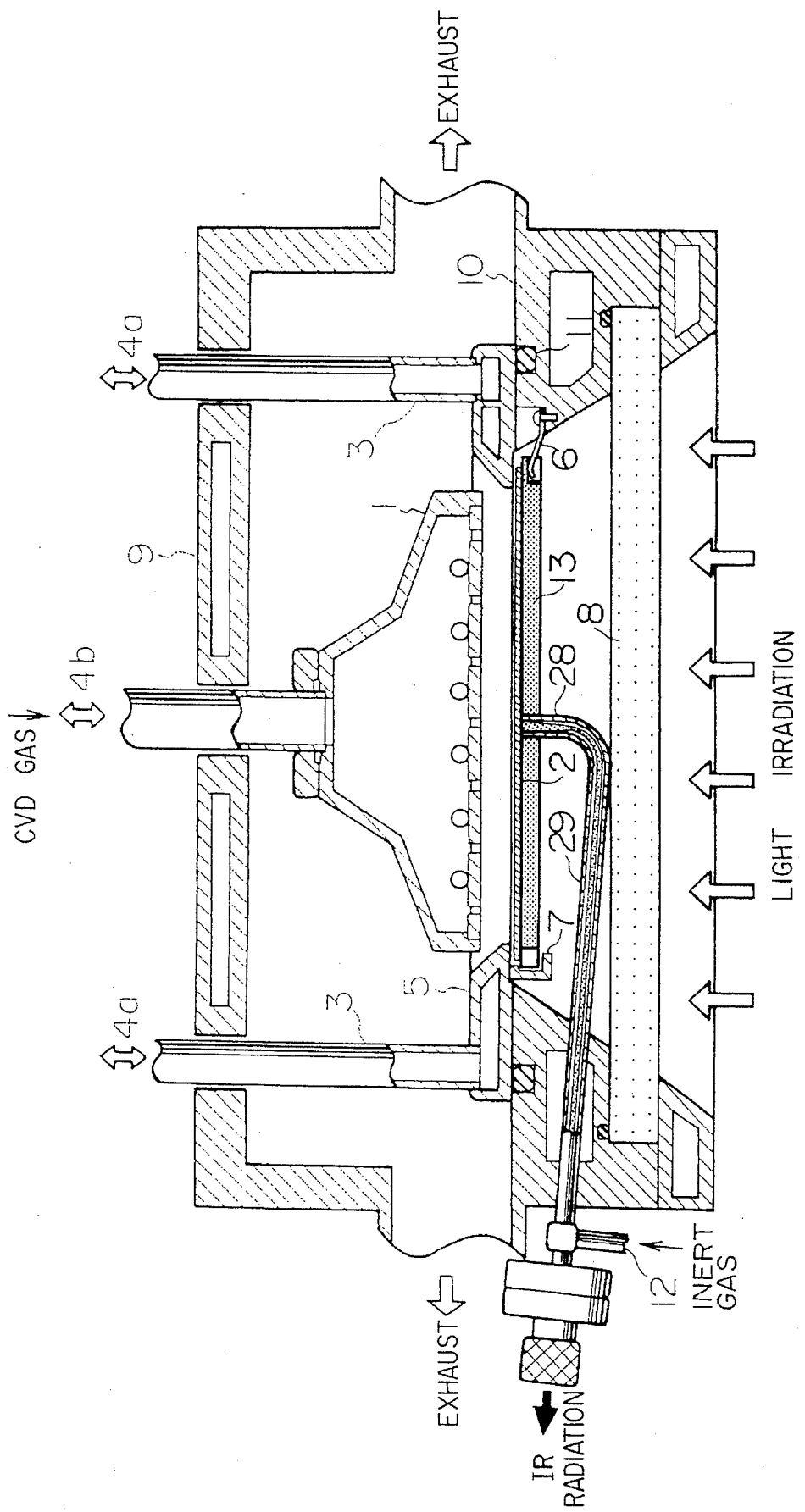
FIG. 33 is a sectional view showing a second embodiment of the CVD reactor apparatus in which a CVD reactor is connected to a monitor.

In wafer heating based on light irradiation as shown in FIGS. 32 and 33, a quartz rod 28 used is prepared by bending a quartz rod of a diameter of 1.5 mm once and has its light receiving end protected by a tubular shield cover 29 connected to the inlet 12 of purge Ar gas so as to be prevented from contacting CVD gas and reaction created gas (not shown). The tubular cover also functions to prevent irradiation light acting as noise in temperature measurement from coming into the side of the quartz rod 28. The quartz rod 28 is connected directly to a fiber cable of 1 mm diameter (not shown) so that radiation light from the wafer may be transmitted to the pyro-thermometer 26 (shown in FIG. 26). Data of wafer temperature thus obtained is inputted to the lamp power supply 32 connected to the pyro-thermometer 26 and used for feedback control which controls the irradiation intensity from the heating lamp 31 to a predetermined wafer temperature.

Figure 34:
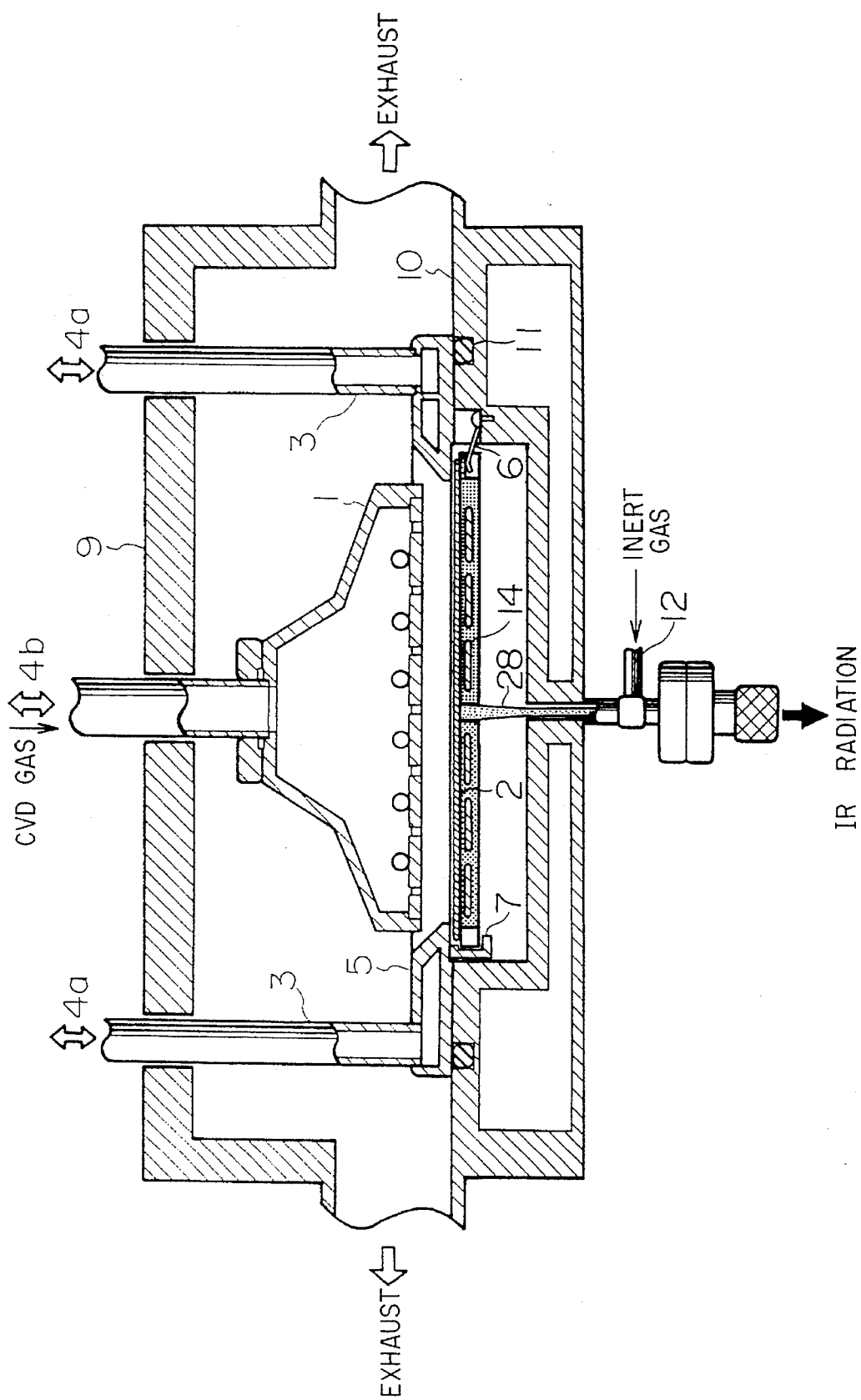
FIG. 34 is a sectional view showing a third embodiment of the CVD reactor apparatus in which a CVD reactor is connected to a monitor.
Figure 35:
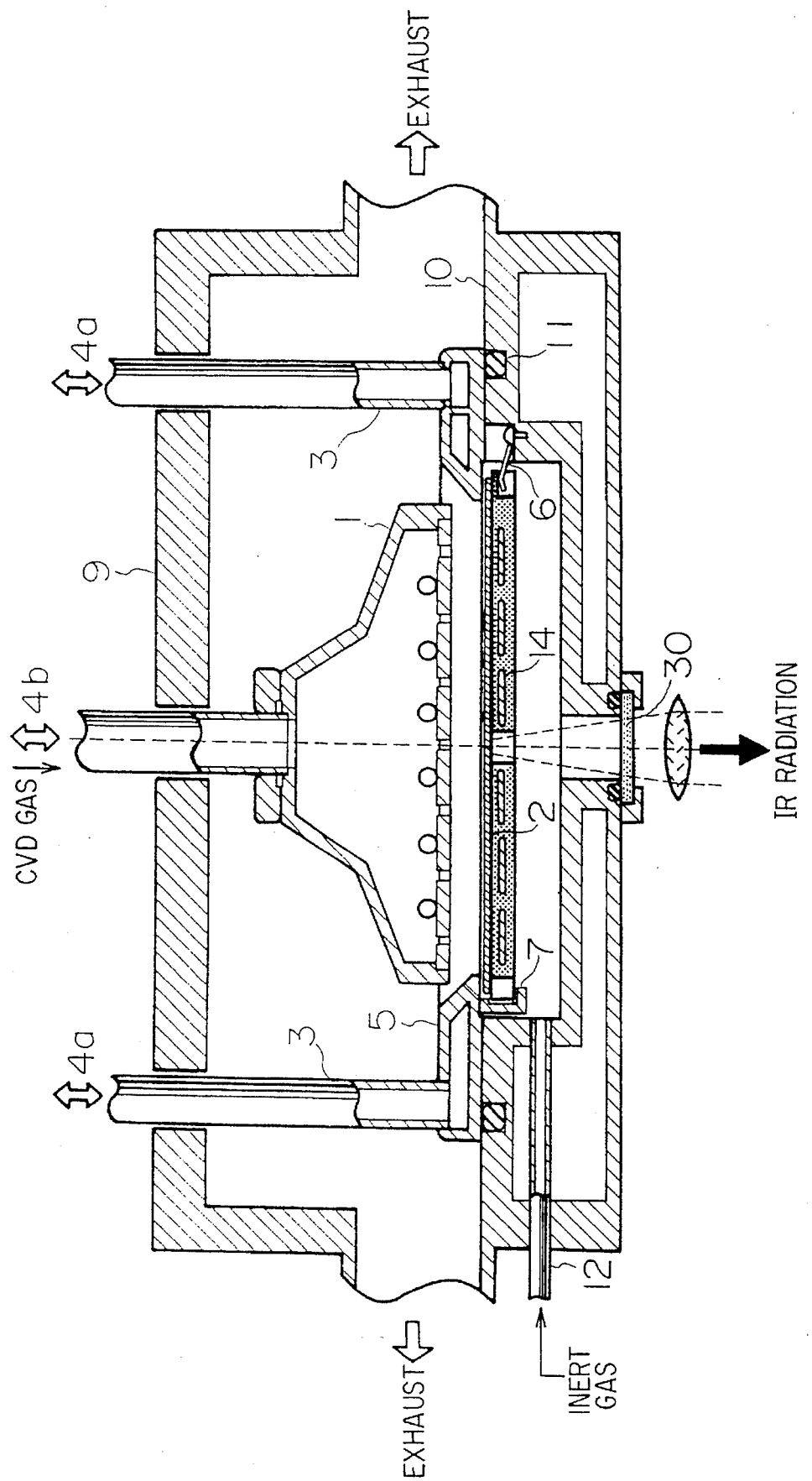
FIG. 35 is a sectional view showing a fourth embodiment of the CVD reactor apparatus in which a CVD reactor is connected to a monitor.

In wafer heating based on the heater stage 14 as shown in FIG. 34, a straight quartz rod 28 is used because the heating lamp 31 which imposes constraint on the arrangement of the wafer temperature monitor is not employed, and the shield cover is omitted because there is no need to suppress noise especially due to irradiation light. Further, in a method shown in FIG. 35 for wafer heating based on the heater stage 14, the quartz rod 28 is not used and infrared irradiation light from the wafer backside is transmitted directly through the IR transparent window 30 and collected by a lens.

Figure 36:
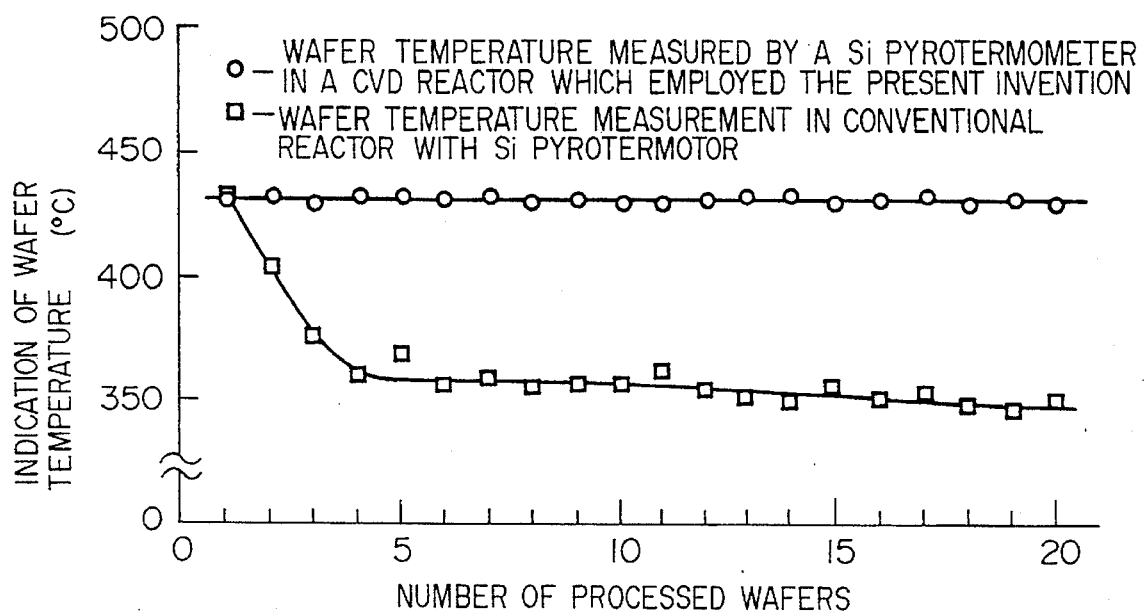
FIG. 36 is a graph comparatively showing changes with time in wafer temperature measured by a pyro-thermometer when a wafer is treated by the reactor of the present inaction and the conventional reactor.

FIG. 36 shows how reading of the pyro-thermometer 26 indicated when blanket deposition of W based on reduction of $H_2$ gas is carried out under the deposition conditions shown in FIG. 29 changes as the number of treated wafers increases. The same type of pyro-thermometer 26 is applied to the conventional apparatus and for comparison, reading of the pyro-thermometer 26 indicated when blanket deposition of W is carried out under the same deposition conditions is concurrently shown in the Figure. In the case of the conventional apparatus, since deposition takes place on portions other than the wafer front in contrast to the case of the use of the reactor according to the present invention, chamber cleaning is effected each time that one wafer is processed.

As is clear from FIG. 36, in the conventional apparatus, the wafer front temperature was observed as starting to decrease at chamber cleaning following the deposition of the first wafer (the initial performance), thus undergoing a remarkable decrease during the processing of the fourth and fifth wafers and thereafter undergoing a gradual decrease, whereas in the reactor apparatus of the present invention, no decrease in the wafer front temperature was observed. Presumably, the temperature is decreased in the conventional apparatus because the end surface of the quartz rod 28 on which infrared radiation from the backside of the wafer 2 is collected is gradually roughened by plasma damage during chamber cleaning and the light collection efficiency is degraded. In effect, through visual observation of the end surface of the quartz rod 28 conducted after the above evaluation, the quartz rod 28 employed in the reactor apparatus of the present invention was proven not to be degraded at all, but the end surface of the quartz rod 28 in the conventional apparatus was proven to be whitely foggy.

Figure 37:
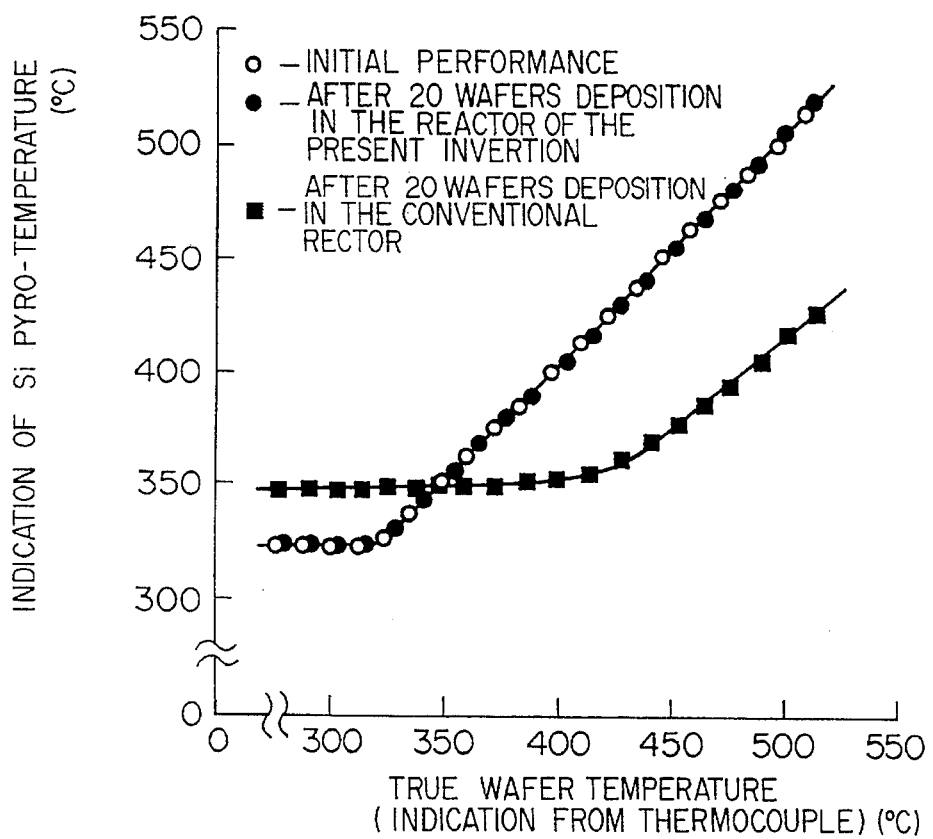
FIG. 37 is a graph comparatively showing changes in the performance of the pyro-thermometer after the wafer is treated by the reactor of the present invention and the conventional reactor.

Further, the initial performance of the pyro-thermometer evaluated as above was compared with the pyro-thermometer performance obtained after deposition processings for 20 wafers were completed with with the reactor of the present invention and the conventional reactor. Results are shown in FIG. 37. With the quartz rod 28 employed in the conventional reactor apparatus, not only does the end surface become whitely foggy and the collection efficiency is reduced to provide an indication which is lower than an actual wafer temperature, but also the toughened end surface is apt to pick-up scattered light other than radiation from the wafer backside to raise the measuring lower limit temperature. In contrast, with the pyro-thermometer connected to the reactor apparatus of the present invention, the pyro-thermometer performance which does not change at all from the initial performance can be obtained even after wafer processing.

As described above, since the reactor apparatus of the present invention does not require chamber cleaning, parts used for the monitor employed in the reactor are not damaged or deteriorated by plasma and do not change with time, thus permitting stable monitoring of the process state (here, the wafer temperature).

As has been described, according to one aspect of the present invention, CVD films are allowed to grow with high selectivity at only desired portions on the silicon wafer front to contribute to improvement in reliability of multilayer wiring of multilayer printed boards used in LSI's and computers in which fine connection holes such as through-holes must be filled with CVD films. Since film formation at unwanted portions inclusive of the interior of the CVD reaction chamber can be prevented, defects attributable to particles resulting from film peel-off occurring throughout the CVD deposition procedure can be decreased to a great extent. Further, since there needs no chamber cleaning before CVD, the throughput can be improved and contaminants generated from the chamber can be reduced to permit a long-term continuous operation, thus improving the operating rate.

According to another aspect of the present invention, in order to prevent degradation of selectivity, a flow path for supplying gas to the backside and side surface of a wafer and the edge of the wafer front on which deposition need not to proceed is separated from a flow path for supplying gas to the wafer front on which deposition must proceed, only the wafer is maintained at at least a temperature for causing CVD reaction, and the reactive gas being about to go around the side surface of the wafer toward the wafer backside is purged by inert gas prevailing on the side of the wafer backside so as not to be adsorbed on the wafer side surface and backside, whereby the CVD reaction gas such as WF6 or $SiH_4$ flowing to the front of the wafer is allowed to be adsorbed substantially on a wafer front portion which is inside the wafer clamp for fixing the wafer edge.

According to an embodiment of the present invention, portions other than the wafer are not maintained at a temperature for causing CVD reaction and therefore the CVD reaction takes place at only a desired area on the wafer front and does not take place at the wafer edge and inner surface of the reactor. This implies that unwanted CVD reaction can be suppressed to ensure that the amount of active substance created by the reaction at portions other than the wafer front, such as the reactor inner wall and susceptor surface, during blanket deposition in the conventional apparatus can be reduced and as a result the selectivity can be improved.

According to another embodiment of the present invention, the wafer temperature can be changed highly responsive to direct light irradiation onto the wafer during processing.

According to still another embodiment of the present invention, the heating means includes heat conduction and heat radiation from the susceptor disposed on the wafer backside to come in contact with the wafer and irradiated and heated by radiation of light from the heating light source such as a lamp disposed exteriorly of the CVD reactor through the transparent window and therefore the temperature distribution can be uniformed relatively easily.

According to still another embodiment of the present invention, the heating means includes heat conduction and heat radiation from the heater stage disposed on the wafer backside to come in contact with the wafer and heated by, for example, resistive heating and therefore the temperature distribution can be made uniform relatively easily.

According to still another embodiment of the present invention, wafers can be transported to a plurality of processing chambers such as pre-treatment chambers, thus greatly contributing to combination and continuous automation of the thin film deposition procedures which will be needed in the future.

According to still another embodiment of the present invention, only information necessary for practical device production can be obtained and process condition control on a real time basis and the quality of product wafers can be ensured to reduce irregularity in working during processing, thus promoting automated operation and contributing to improvement in productivity.

According to still another embodiment of the present invention, since portions other than the wafer are not maintained at a temperature for causing CVD reaction and the CVD reaction is allowed to take place only at a desired area on the wafer front, information about reaction progression monitoring which an object to be monitored needs for device production can be obtained and process condition control on a real time basis and quality product wafers can be ensured to reduce irregularity in working during processing, thus promoting automated operation and contributing to improvement in productivity.

According to still another embodiment of the present invention, since unwanted film formation does not occur at portions other than the wafer front and there is no need to perform chamber cleaning, the temperature of the substrate can be monitored without causing parts of the temperature monitor to be damaged by plasma so as to be deteriorated changed with time and process condition control on a real time basis and quality product wafers can be ensured to reduce irregularity in working during processing, thus promoting automated operation and contributing to improvement in productivity.

According to still another embodiment of the present invention, reaction progression monitoring and temperature can be monitored simultaneously and therefore more precise process condition control on a real time basis and quality product wafers can be ensure to reduce irregularity in working during processing, thus promoting automated operation and contributing to improvement in productivity.

What is claimed is:

1. A CVD reactor apparatus for forming a CVD reaction film on the surface of a substrate in a CVD reactor by using a reactive gas, comprising:

a ring-shaped or frame-shaped substrate clamp for clamping a peripheral edge of a front of said substrate disposed in said reactor and dividing a space inside said reactor into a first space adjacent the front of said substrate and a second space adjacent the backside of said substrate, said substrate clamp having projections for setting up, between said substrate clamp and the peripheral edge of the front of said clamped substrate, a gap through which the first space communicates with the second space;

substrate clamp moving means for moving said substrate clamp vertically;

a plurality of lift pins fixed to said substrate clamp and operative to engage the backside of said substrate for suspending and lifting said substrate;

a ring-shaped or frame-shaped stopper disposed beneath said substrate clamp and being in contact with said substrate to surround said substrate;

a seal which seals, in an airtight manner, a contact portion between said substrate clamp and said stopper;

a plurality of spring-shaped substrate susceptor pins fixed to the inner side of said stopper and operative to push up said substrate at its backside by a force which does not damage said substrate and flex downwards by themselves when said substrate is pushed down by said substrate clamp;

a first gas supply which supplies the reactive gas to the substrate front through the first space; and an inert gas supply which supplies inert gas to a space adjacent the substrate backside which is surrounded by an inner wall of said stopper, a lower surface of said substrate clamp and the bottom of said reactor.

2. A CVD reactor apparatus according to claim 1, further comprising a cooler unit which cools the temperature of surfaces in contact with the reactive gas, including the reactor inner wall, a surface of said first gas supply and the upper surface of said substrate clamp which adjoin the space on the side of the substrate front, yet excluding the substrate front, to a temperature equal to or less than a deposition reaction lower limit.

3. A CVD reactor apparatus according to claim 1, further comprising a susceptor disposed adjacent the substrate backside in contact with said substrate, a heating light source disposed exterior to said CVD reactor, which provides direct irradiation of radiation light through a transparent window to heat said susceptor, said susceptor providing heat conduction and heat radiation to heat said substrate.

4. A CVD reactor apparatus according to claim 3, wherein said heating light source comprises a lamp.

5. A CVD reactor apparatus according to claim 3 wherein said susceptor is larger in size than said substrate, is formed with members which prevent said susceptor from contacting said substrate lift pins during vertical movement of said substrate lift pins so that only said substrate may be lifted by said lift pins, and is carried on said substrate susceptor pins.

6. A CVD reactor apparatus according to claim 1, further comprising a heater stage, disposed adjacent the substrate backside in contact with said substrate, which heats said substrate by heat conduction and radiation, wherein said heater stage is heated by resistive heating.

7. A CVD reactor apparatus according to claim 6, wherein said heater stage is larger in size than said substrate, is formed with members which prevent said heater stage from contacting said substrate lifter pins during vertical movement of said substrate susceptor pins so that only said substrate may be lifted by said lift pins, and is carried on said substrae susceptor pins.

8. A CVD reactor apparatus according to claim 1 wherein said CVD reactor is connected to another process reactor.

9. A CVD reactor apparatus according to claim 1, further comprising a reaction gas monitor, connected to said CVD reactor, which only monitors reactions on the front of said substrate.

10. A CVD reactor apparatus according to claim 9, wherein said reaction gas monitor connected to said CVD reactor includes a CVD gas inlet for introducing part of a gas prevailing in said CVD reactor and a mass analyzer exhausted differentially.

11. A CVD reactor apparatus according to claim 1, further comprising a substrate temperature monitor which monitors the temperature of said substrate and means for connecting said monitor to said CVD reactor without causing operation of said substrate temperature monitor to change with time.

12. A CVD reactor apparatus according to claim 11, wherein said substrate temperature monitor connected to said CVD reactor includes a light guide for receiving, at one end surface, infrared light radiated from the substrate backside and tramistting it to the other end surface, and calculation means for picking up the infrared light to detect the intensity thereof and calculating the temperature of said substrate from the detection results.

13. A CVD reactor apparatus according to claim 11, wherein said substrate temperature monitor connected to said CVD reactor includes a transparent window for isolating the inside of said CVD reactor from atmosphere and delivering infrared light radiated from the substrate backside to the outside of said CVD reactor, a collection lens for collecting the infrared light transmitting through said transparent window, and calculation means for picking up the infrared light to detect the intensity thereof and calculating the temperature of said substrate from the detection results.

14. A CVD reactor apparatus according to claim 1, further comprising a reaction gas monitor, which only monitors reactors on the substrate front connected to said CVD reactor, a substrate temperature monitor, which monitors the temperature of said substrate and means connecting said substrate temperature monitor to said CVD without causing said temperature monitor to change with time.

15. A CVD reactor apparatus according to claim 14, wherein said reaction gas monitor connected to said CVD reactor includes a CVD gas inlet for introducing part of gas prevailing in said CVD reactor and a mass analyzer exhausted differentially.

16. A CVD reactor apparatus according to claim 14, wherein said substrate temperature monitor connected to said CVD reactor includes a light guide for receiving, at one end surface, infrared light radiated from the substrate backside and transmitting it to the other end and calculation means for picking up the infrared light to detect the intensity thereof and calculating the temperature of said substrate from the detection results.

17. A CVD reactor apparatus according to claim 14, wherein said substrate temperature monitor connected to said CVD reactor includes a transparent window for isolating the inside of said CVD reactor from the atmosphere and passing infrared light radiated from the substrate backside to the outside of said CVD reactor, a collection lens for collecting the infrared light transmitting through said transparent window, and calculation means for picking up the infrared light to detect the intensity thereof and calculating the temperature of said substrate from the detection results.

18. A CVD reactor apparatus according to claim 1, further comprising a heating light source, disposed exterior to said CVD reactor, which provides direct irradiation of radiation light through a transparent window.

19. A CVD reactor apparatus according to claim 18, wherein said heating light source comprises a lamp.

20. A CVD reactor apparatus for forming a CVD reaction film on a surface of a substrate in a reactor by using a reactive gas comprising:

a substrate clamp for clamping a peripheral edge of a front of said substrate disposed in said reactor and dividing a space inside said reactor into a first space adjacent the front of said substrate and a second space adjacent a backside of said substrate, said substrate clamp having projections for providing, between said substrate clamp and the peripheral edge of the front of said clamped substrate, a gap through which the first space communicates with the second space;

a first gas source which supplies a first gas to the first space, said first gas containing at least a CVD gas;

a second gas source which supplies an inert gas, which does not contain CVD gas, to the second space at a pressure higher than a pressure prevailing in the first space so as to pass the inert gas supplied to the second space through said gap to thereby prevent the CVD gas prevailing in the first space from contacting the substrate backside and the substrate edge;

a susceptor disposed adjacent the substrate backside in contact with said substrate;

a heating light source, disposed exterior to said CVD reactor, which provides direct irradiation of radiation light through a transparent window to heat said susceptor, said susceptor providing heat conduction and heat radiation to heat said substrate;

a cooler unit which cools the surface temperature of an inner wall of the reactor in contact with the CVD gas prevailing in the first space, except the substrate front, to a temperature equal to or lower than a deposition lower limit; and a plurality of lift pins fixed to said substrate clamp and operative to engage the backside of said substrate for suspending and lifting said substrate, wherein said susceptor is larger in size than said substrate, is formed with members which prevent said susceptor from contacting said substrate lift pins during vertical movement of said substrate lift pins so that only said substrate may be lifted by said lift pins, and is carried on said substrate susceptor pins.

21. A CVD reactor apparatus for forming a CVD reaction film on the surface of a substrate in a reactor, by using a reactive gas comprising:

a substrate clamp for clamping a peripheral edge of a front of said substrate disposed in said reactor and dividing a space inside said reactor into a first space adjacent the front of said substrate and a second space adjacent a backside of said substrate, said substrate clamp having projections for providing, between said substrate clamp and the peripheral edge of the front of said clamped substrate, a gap through which the first space communicates with the second space;

a first gas source which supplies a first gas to the first space, said first gas containing at least a CVD gas;

a second gas source which supplies an inert gas, which does not contain CVD gas, to the second space at a pressure higher than a pressure prevailing in the first space to pass the inert gas supplied to the second space through said gap to thereby prevent the CVD gas prevailing in the first space from contacting the substrate backside and the substrate edge;

a heater stage, which heats said substrate and is disposed adjacent the substrate backside in contact with said substrate and is heated by resistive heating to provide heat conduction and heat radiation; and a cooler unit which cools the surface temperature of an inner wall of the reactor in contact with the CVD gas prevailing in the first space, except the substrate front, to a temperature equal to or lower than a deposition lower limit; and a plurality of lift pins fixed to said substrate clamp and operative to engage the backside of said substrate for suspending and lifting said substrate, wherein said heater stage is larger in size than said substrate, and is formed with members which prevent said heater stage from contacting said substrate lifter pins during vertical movement of said substrate susceptor pins.

* * * * *